(12) United States Patent
Yeh et al.

(10) Patent No.: US 11,897,759 B2
(45) Date of Patent: Feb. 13, 2024

(54) SEMICONDUCTOR DEVICE AND METHOD FOR FORMING THE SAME

(71) Applicant: TAIWAN SEMICONDUCTOR MANUFACTURING COMPANY LTD., Hsinchu (TW)

(72) Inventors: Po Chen Yeh, New Taipei (TW); Yi-Hsien Chang, Changhua County (TW); Fu-Chun Huang, Hsinchu County (TW); Ching-Hui Lin, Taichung (TW); Chiahung Liu, Hsinchu (TW); Shih-Fen Huang, Hsinchu County (TW); Chun-Ren Cheng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/838,023

(22) Filed: Jun. 10, 2022

(65) Prior Publication Data

US 2023/0399225 A1 Dec. 14, 2023

(51) Int. Cl.
*B81B 7/00* (2006.01)
*B81C 1/00* (2006.01)

(52) U.S. Cl.
CPC .......... *B81B 7/007* (2013.01); *B81C 1/00301* (2013.01); *B81B 2201/0271* (2013.01); *B81B 2203/0127* (2013.01); *B81B 2207/012* (2013.01); *B81B 2207/07* (2013.01); *B81B 2207/097* (2013.01); *B81C 2203/0792* (2013.01)

(58) Field of Classification Search
CPC ............ B81B 7/007; B81B 2201/0271; B81B 2203/0127; B81B 2207/012; B81B 2207/07; B81B 2207/097; B81C 1/00301; B81C 2203/0792
See application file for complete search history.

(56) References Cited

U.S. PATENT DOCUMENTS

| 10,944,041 | B1 | 3/2021 | Tsai |
| 2021/0193904 | A1 | 6/2021 | Tsai et al. |
| 2021/0375765 | A1 | 12/2021 | Tseng et al. |

*Primary Examiner* — Samuel A Gebremariam
(74) *Attorney, Agent, or Firm* — WPAT Law; Anthony King

(57) ABSTRACT

The present disclosure provides a semiconductor device. The semiconductor device includes a first device and a second device disposed adjacent to the first device; a conductive pillar disposed adjacent to the first device or the second device; a molding surrounding the first device, the second device and the conductive pillar; and a redistribution layer (RDL) over the first device, the second device, the molding and the conductive pillar, wherein the RDL electrically connects the first device to the second device and includes an opening penetrating the RDL and exposing a sensing area over the first device.

20 Claims, 40 Drawing Sheets

SEMICONDUCTOR DEVICE AND METHOD FOR FORMING THE SAME

BACKGROUND

Micro-electro mechanical system (MEMS) devices have recently been developed and are commonly included in electronic equipment. The MEMS devices are micro-sized devices that include a number of elements (e.g., stationary or movable elements) for achieving electro-mechanical functionality. Among the various applications of MEMS technologies, e.g., motion sensors, pressure sensors, inertial sensors, and printer nozzles, micromachined ultrasonic transducers (MUT) have gained widespread attention due to their superior performance compared to conventional ultrasonic sensors.

While extensive research has been conducted in hopes of improving techniques related to the MUT, such techniques still fail to meet many requirements, including the need to increase sensing bandwidth and high frequency operation. Therefore, there is a need to further improve the structures and manufacturing methods of MUTs.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures can be arbitrarily increased or reduced for clarity of discussion.

DETAILED DESCRIPTION

Figure 1:
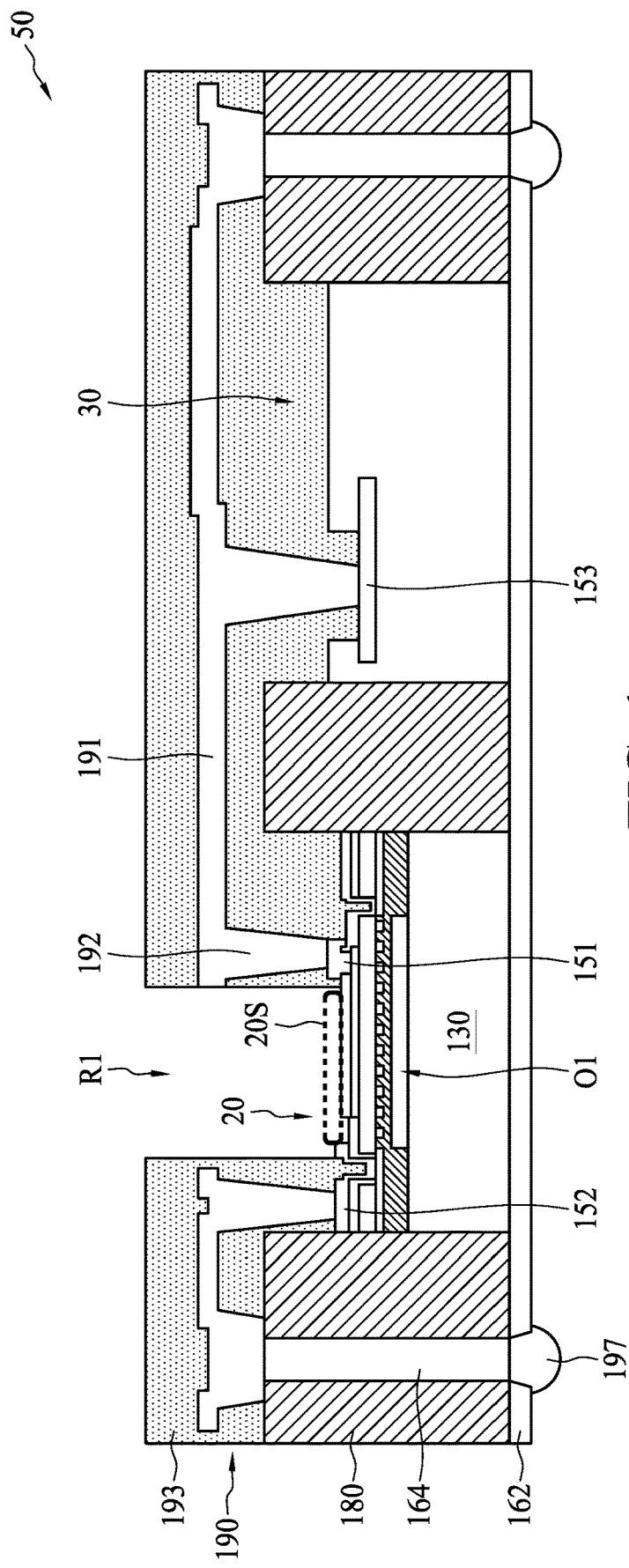
FIG. 1 is a schematic cross-sectional view of a semiconductor device including a piezoelectric micromachined ultrasonic transducer (PMUT) device and an application specific integrated circuit (ASIC) die, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure discusses structures and fabrication methods of a hybrid micromachined ultrasonic transducer (MUT) device in which piezoelectric MUT (PMUT) devices or capacitive MUT (CMUT) devices is integrated and operated collaboratively with another die such as logic die, ASIC die or the like. The PMUT device is usually operated at a relatively high intensity and renders low-to-medium resolutions. The CMUT device is widely used in high-resolution applications that do not support high ultrasonic intensity. In view of the foregoing, an integrated MUT device manufactured using semiconductor technologies can provide performance superior to that of the standalone PMUT or CMUT devices.

FIG. 1 is a schematic cross-sectional view of a semiconductor device 50 including a transducer device 20 and a die 30. For simplicity and clarity, FIG. 1 illustrates the transducer device 20 as a PMUT device 20, and the die 30 as an ASIC die 30. However, it is understood that the PMUT device 20 and the ASIC die 30 are examples for the purpose of explaining the present disclosure. It is understood that the transducer device 20 can be other kinds of transducer devices, and the die 30 can be other kinds of dies. In some embodiments, the ASIC die 30 is disposed adjacent to the PMUT device 20. The ASIC die 30 includes a digital signal processing (DSP) chip, a driver or a decoder. A conductive pillar 164 is disposed adjacent to the PMUT device 20 or the ASIC die 30. A molding compound 180 surrounds the PMUT device 20, the ASIC die 30 and the conductive pillar 164. A redistribution layer (RDL) 190 is disposed over the PMUT device 20, the ASIC die 30, the molding compound 180 and the conductive pillar 164. The RDL 190 includes multiple connected horizontal wires 191 and vertical pillars 192 embedded in an isolation layer 193. The RDL 190 electrically connects the PMUT device 20 to the ASIC die 30. The RDL 190 includes an opening R1 penetrating the RDL 190. The opening R1 exposes a sensing area 20S over the PMUT device 20. The PMUT device 20 includes conductive features 151 and 152 disposed thereon. The ASIC die 30 includes a conductive feature 153 disposed thereon. The conductive features 151, 152 and 153 face the RDL 190. The conductive features 151 and 152 on the PMUT device 20 are electrically coupled to the conductive feature 153 on the ASIC die 30 through one or some of the horizontal wires 191 and the vertical pillars 192. A die attach film (DAF) 162 may be disposed below and in contact with the conductive pillar 164, the PMUT device 20 and the ASIC die 30. The DAF 162 is separated from the RDL 190. A solder ball 197 is disposed on and electrically coupled to the conductive pillar 164.

Figure 2:
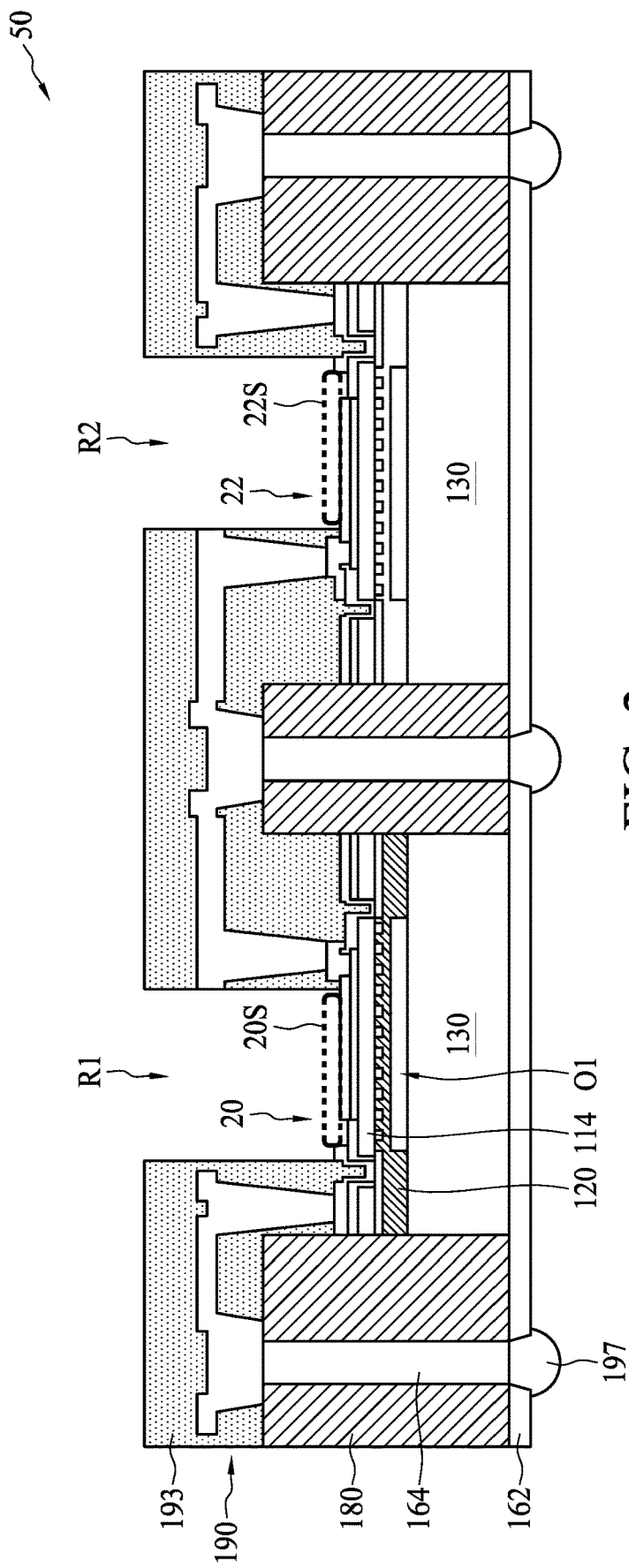
FIG. 2 is a schematic cross-sectional view along a different cross-section of the semiconductor device in FIG. 1, in accordance with some embodiments of the present disclosure.

FIG. 2 is a schematic cross-sectional view along a different cross-section of the semiconductor device 50 in FIG. 1. The semiconductor device 50 includes a PMUT device 22 adjacent to the PMUT device 20. The ASIC die 30 is not shown in FIG. 2. The molding compound 180 surrounds the PMUT device 20 and the PMUT device 22. The PMUT device 20 and the PMUT device 22 are separated by the molding compound 180. The RDL 190 is disposed over the PMUT device 20, the PMUT device 22 and the molding compound 180. The RDL 190 electrically connects the PMUT device 20 to the PMUT device 22. The RDL 190 includes an opening R2 penetrating the RDL 190. The opening R2 exposes a sensing area 22S over the PMUT device 22. The sensing area 20S and the sensing area 22S are separated by the isolation layer 193 of the RDL 190. The conductive pillar 164 is disposed adjacent to the PMUT device 20 or the PMUT device 22. The conductive pillar 164 may be disposed between the PMUT device 20 and the PMUT device 22. The conductive pillar 164 is surrounded by the molding compound 180 and covered by the isolation layer 193. Each one of the PMUT device 20 and the PMUT device 22 includes a carrier 130 and a piezoelectric layer 114 over the carrier 130. A membrane 120 is disposed on the carrier 130. A cavity O1 is between the membrane 120 and the carrier 130. The piezoelectric layer 114 is sandwiched between a pair of electrodes.

Figure 3C:
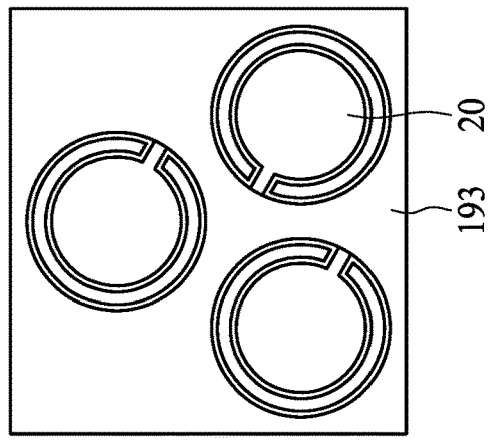
FIGS. 3A to 3C are top views of different arrangements of PMUT devices, in accordance with some embodiments of the present disclosure.
Figure 3B:
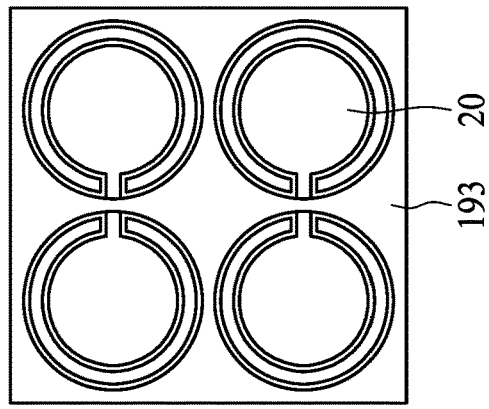
Figure 3A:
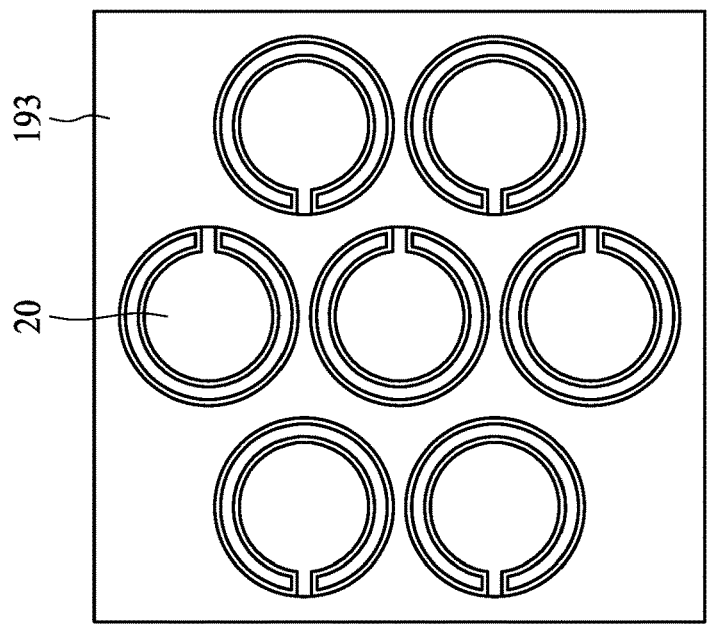

FIGS. 3A to 3C are top views of different arrangements of PMUT devices 20. In some embodiments, multiple PMUT devices 20 are arranged in a hexagonal, square or trigonal array, which are respectively shown in FIGS. 3A to 3C. The PMUT devices 20 may be separated by the molding compound 180 (not shown). In some embodiments, the sensing area of each PMUT device 20 is isolated by the isolation layer 193. Each PMUT device 20 may be electrically coupled to a common ASIC die 30 through the RDL 190.

Figure 4A:
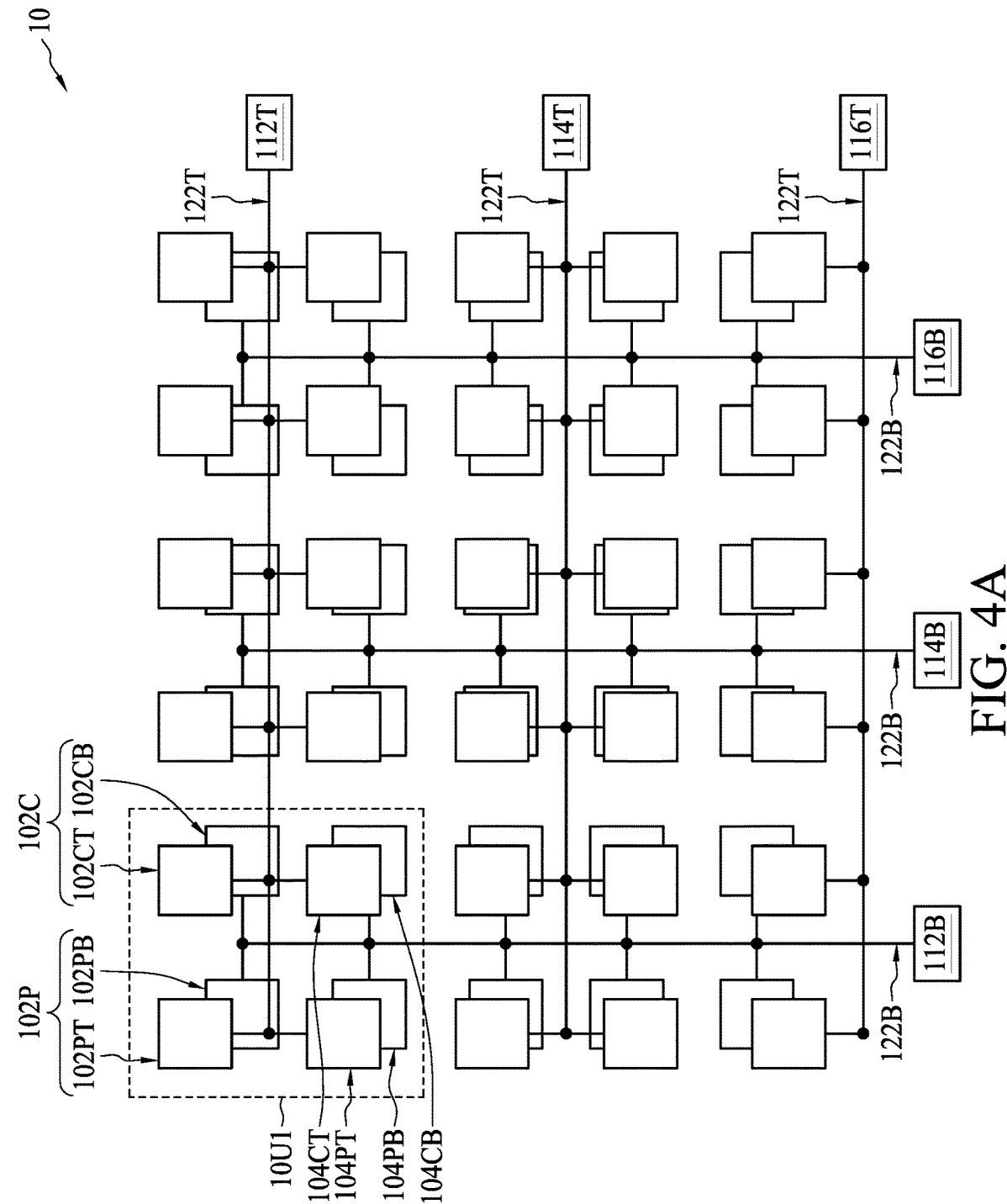
FIG. 4A is a schematic top view of a MUT device, in accordance with some embodiments of the present disclosure.

FIG. 4A is a schematic top view of a MUT device 10. The MUT device 10 is a hybrid MUT device including at least two types of MUT devices, such as a PMUT type and a CMUT type. FIG. 4A illustrates selected features of the detailed MUT device 10 for the sake of clarity. These selected features are described in greater detail along with other features with reference to the cross-sectional views of subsequent figures.

The MUT device 10 includes an array of MUT units, such as exemplary PMUT units 102P and 104P and exemplary CMUT units 102C and 104C. Throughout the present disclosure, the term "MUT unit" refers to a basic ultrasonic transducer entity, functioning in a piezoelectrically or capacitively-driven manner and configured to generate and receive ultrasonic signals through a control waveform. One or more MUT units may be appropriately grouped to form a larger transducer entity. For example, FIG. 4A shows an operation unit 10U1 on the upper-left corner of the array. The operation unit 10U1 is composed of two PMUTs and two CMUTs and operates as a single transducer entity. In other embodiments, a transducer unit may be formed purely of PMUT units or purely of CMUT units. As shown in FIG. 4A, the MUT device 10 includes columns of PMUT units and columns of CMUT units where the PMUT columns and CMUT columns are alternately disposed. The depicted topology of the MUT device 10 is shown for illustrative purposes. Other arrangements of PMUT and CMUT units for forming the array of the MUT device 10 are also within the contemplated scope of the present disclosure. In addition, the top electrodes (e.g., top electrodes 102PT, 104PT, 102CT and 104CT) are aligned with the respective bottom electrodes (e.g., bottom electrodes 102PB, 104PB, 102CB and 104CB) in a vertical direction. The top electrodes are illustrated in FIG. 4A as being out of alignment with the respective bottom electrodes merely for the purpose of making the bottom electrodes visible.

Each of the PMUT units, e.g., the PMUT unit 102P or 104P, includes a top electrode 102PT or 104PT and a bottom electrode 102PB or 104PB. A piezoelectric layer (not separately shown) is disposed between the top electrode (102PT or 104PT) and the bottom electrode (102PB or 104PB). The top electrode, bottom electrode and the piezoelectric layer of the PMUT unit 102P or 104P are formed as a membrane stack. The membrane stack of the PMUT unit 102P or 104P is flexible for deflection and configured to generate sensing charges in response to applied mechanical stress (i.e., piezoelectric effect) or generate ultrasonic waves in response to an applied electric field (i.e., reverse piezoelectric effect).

Each of the CMUT units, e.g., the CMUT unit 102C or 104C, includes a top electrode 102CT or 104CT and a bottom electrode 102CB or 104CB. The top electrode (102CT or 104CT) and the bottom electrode (102CB or 104CB) are configured to form a capacitor and are separated by an insulating material, an air gap or a vacuum gap. The top electrode or the bottom electrode of the CMUT unit 102C or 104C is flexible for deflection and configured to generate sensing charges in response to the distance between the top electrode (102CT or 104CT) and the bottom electrode (102CB or 104CB), or generate ultrasonic waves with the movable top electrode or bottom electrode in response to an applied electric field.

The top electrodes (e.g., 102PT, 104PT, 102CT and 104CT) and the bottom electrodes (e.g., 102PB, 104PB, 102CB and 104CB) may be formed of conductive materials, such as polysilicon or metallic materials, e.g., gold, silver, copper, tungsten, aluminum, titanium, tantalum, and the like. The aforesaid top electrodes and bottom electrodes have a quadrilateral shape from a top-view perspective. However, other shapes of the top electrodes and bottom electrodes are also possible, such as a circular shape, a polygonal shape, a bar shape and a ring shape. These top electrodes and bottom electrodes are electrically insulated from their surroundings by insulating materials (not separately shown), such as oxide, nitride, polymer, or other suitable insulator. In the depicted embodiment, the component MUT units (including the CMUT unit and the PMUT unit) of the MUT device 10 include individual top electrodes and bottom electrodes, and the top electrode (e.g., 102PT, 104PT, 102CT and 104CT) of a MUT unit is aligned with the respective bottom electrode (e.g., 102PB, 104PB, 102CB and 104CB). Each of the PMUT units is surrounded by at least two CMUT units, and each of the CMUT units is surrounded by at least two PMUT units. In some other embodiments, the PMUT and CMUT devices are alternately disposed such that each of the PMUT units is surrounded by at least four CMUT units, and each of the CMUT units is surrounded by at least four PMUT units. In some embodiments, the CMUT units and PMUT units are arranged to form a crisscross pattern.

The MUT device 10 further includes a wiring structure electrically coupling the PMUT units and CMUT units to supply or control circuits (not separately shown). These supply and control circuits are electrically coupled to the conductive pads 112T, 114T, 116T, 112B, 114B and 116B. Conductive lines, collectively labeled as 122T, electrically couple the top electrodes (i.e., 102PT, 104PT, 102CT and 104CT) to the conductive pads 112T, 114T and 116T. Similarly, conductive lines, collectively labeled as 122B, electrically couple the bottom electrodes (i.e., 102PB, 104PB, 102CB and 104CB) to the conductive pads 112B, 114B and 116B. During operation, electric waveforms are transmitted to the top electrodes and bottom electrodes of the respective PMUT units or CMUT units through the conductive pads 112T, 114T, 116T, 112B, 114B and 116B and the conductive lines 122T and 122B for performing sensing or generation of ultrasound, depending on the designed control waveforms.

Figure 4B:
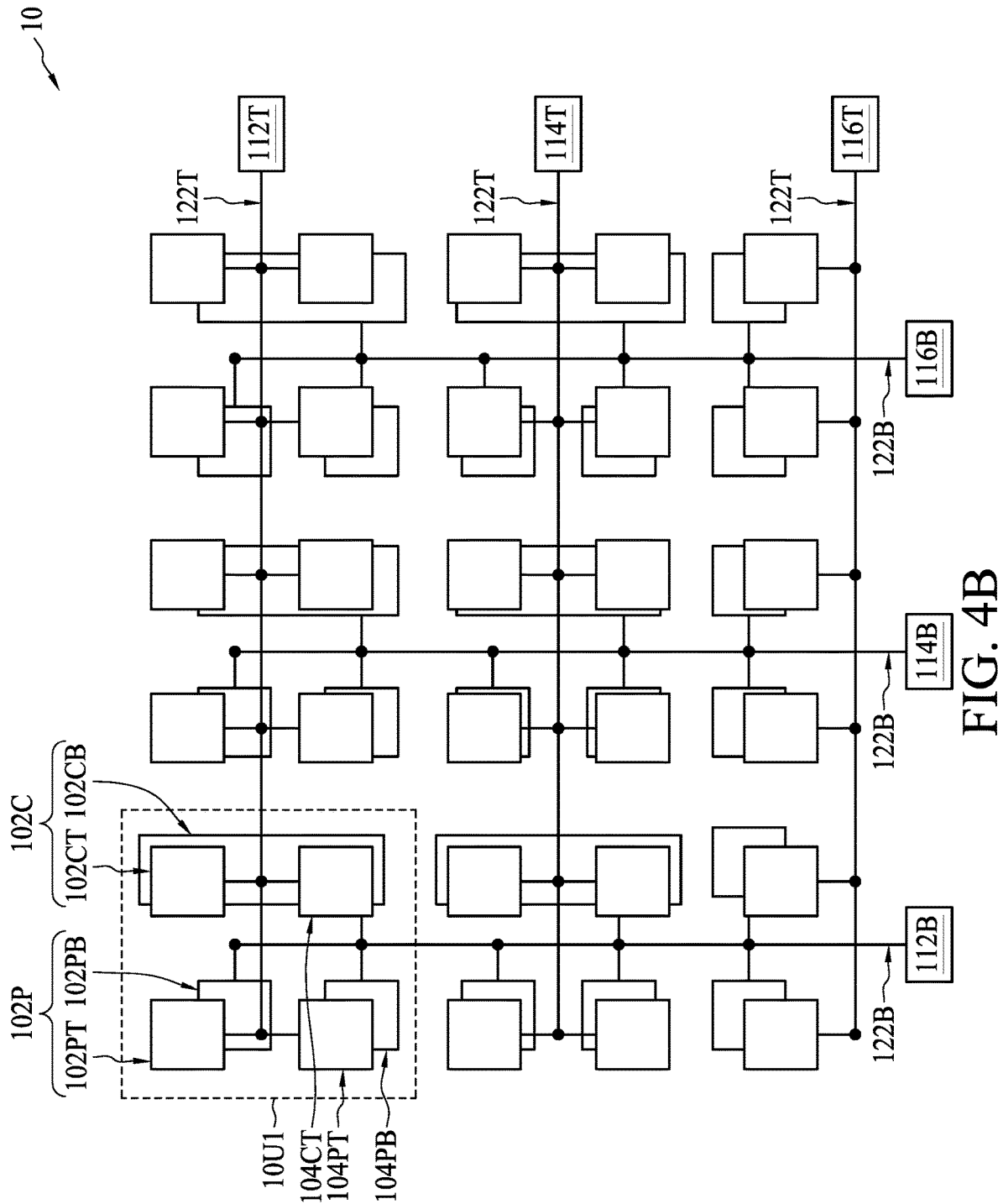
FIG. 4B is a schematic top view of another MUT device, in accordance with some embodiments of the present disclosure.

FIG. 4B is a schematic top view of a MUT device 11. The MUT device 11 is similar to the MUT device 10 in FIG. 4A except that some of the CMUT units (e.g., CMUT units 102C and 104C) share a bottom electrode 102CB'. In the depicted example, the shared bottom electrode 102CB' has an electrode area greater than the electrode area of the bottom electrode 102CB or 104CB. The shared bottom electrode 102CB' is aligned with the top electrodes 102CT and 104CT. Although not illustrated, the MUT device 11 can also be constructed such that two or more of the PMUT units or the CMUT units are grouped and share a common top electrode, a bottom electrode, or both. The grouped MUT units with shared electrodes naturally form a transducer entity and function as a unit to perform sensing or generation of ultrasound.

Figure 5:
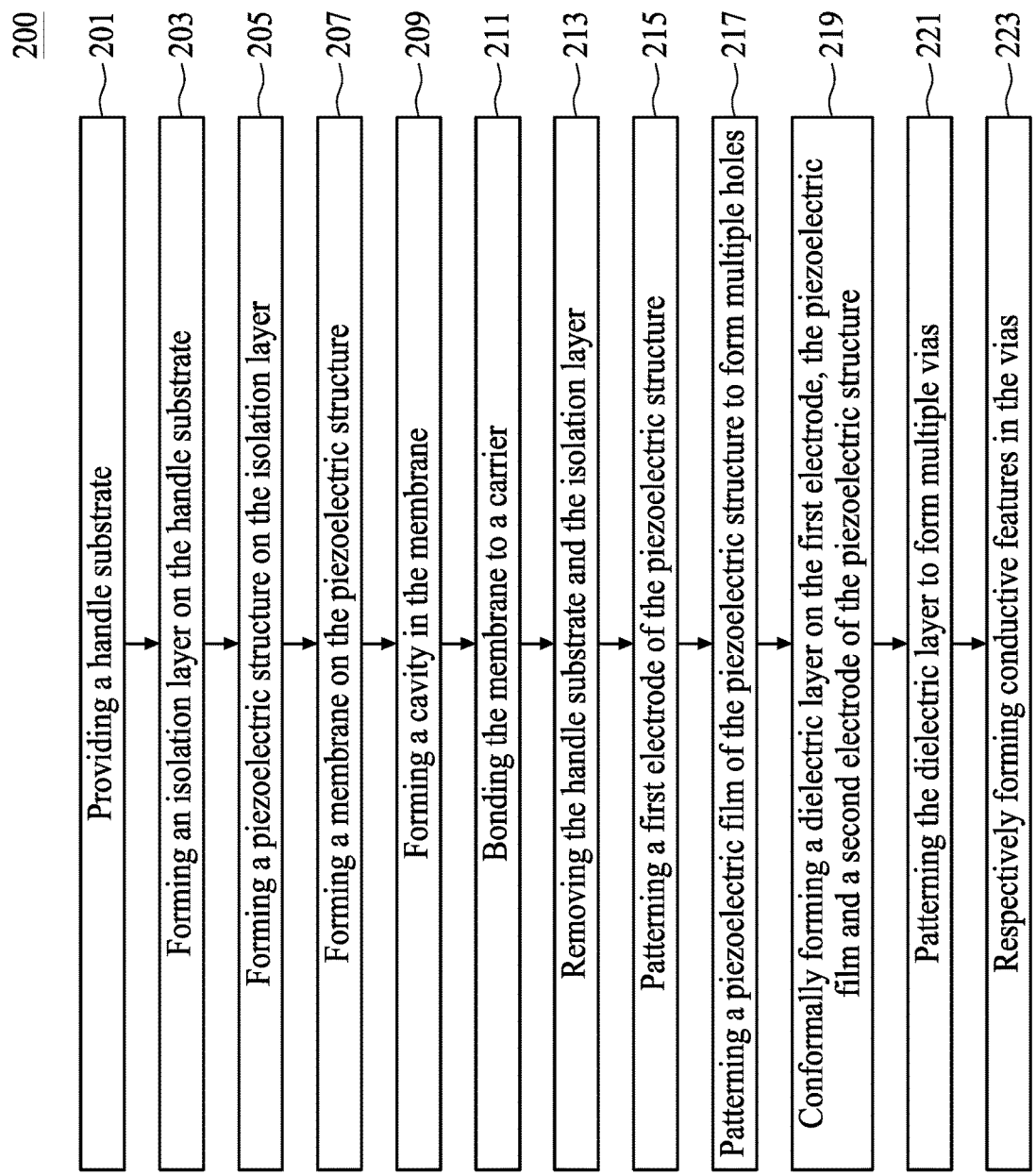
FIG. 5 is a flow diagram showing a method of fabricating a PMUT device.

FIG. 5 is a flow diagram showing a method 200 of fabricating a PMUT device 20. FIGS. 6 to 7, 8A to 8D, and 9 to 18 are schematic cross-sectional views illustrating sequential operations of the method 200 shown in FIG. 5, in accordance with some embodiments of the present disclosure.

Figure 6:
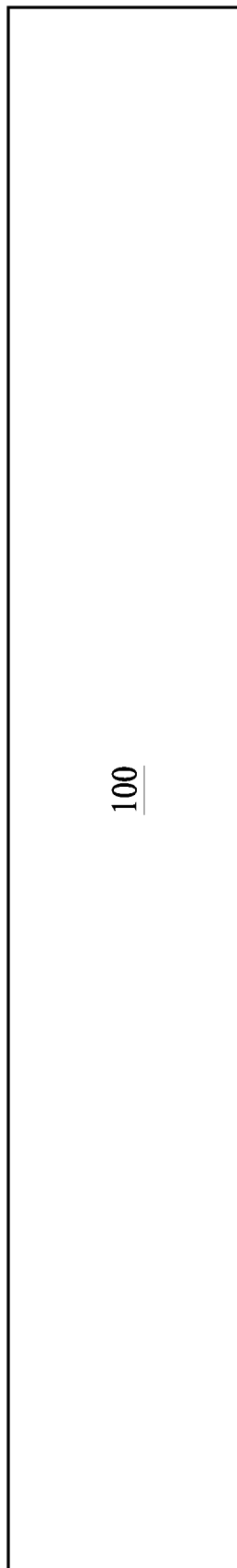
FIGS. 6 to 7, 8A to 8D, and 9 to 18 are schematic cross-sectional views illustrating sequential operations of the method shown in FIG. 5, in accordance with some embodiments of the present disclosure.

In operation 201, a carrier substrate 100 is provided, as shown in FIG. 6. In some embodiments, the carrier substrate 100 includes a silicon substrate, a glass substrate or a metallic substrate. In some embodiments, the carrier substrate 100 is a polycrystalline silicon substrate or a silicon-on-insulator (SOI) substrate.

Figure 7:
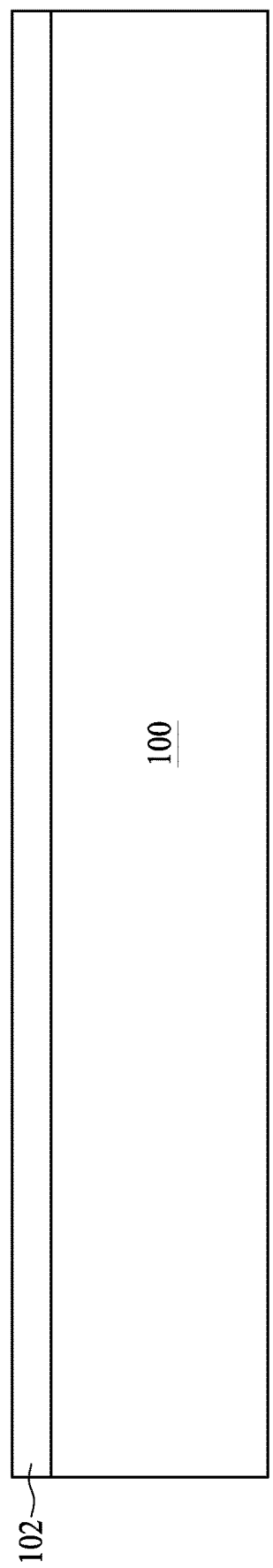

In operation 203, an isolation layer 102 is formed on the handle substrate 100, as shown in FIG. 7. In some embodiments, the isolation layer 102 is made of silicon oxide ($SiO_2$). The isolation layer 102 may be formed using thermal oxidation, chemical vapor deposition (CVD) or other suitable methods. In some embodiments, the isolation layer 102 has a thickness between about 10 nanometers (nm) and about 10000 nm.

Figure 8A:
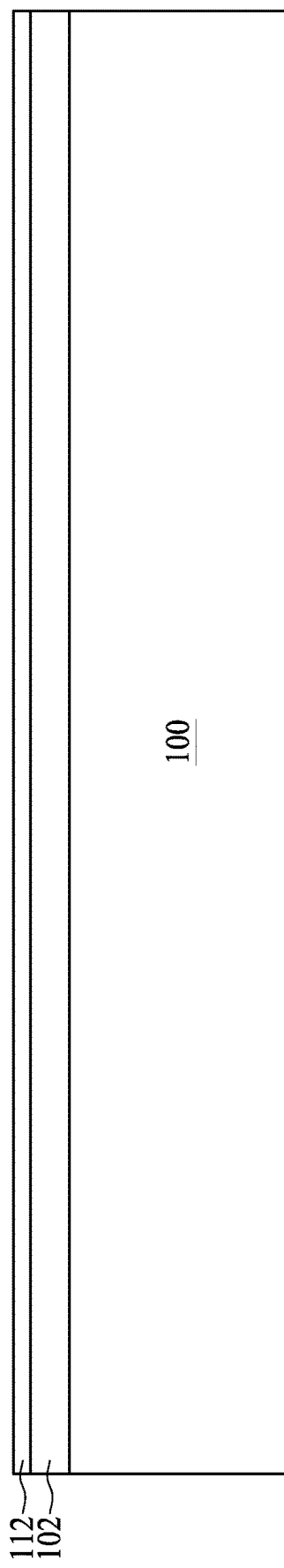

In operation 205, a piezoelectric structure 110 is formed on the isolation layer 102, as shown in FIGS. 8A to 8D. Referring to FIG. 8A, a conductive material such as Pt, Au, Zn, Cu, Al, Ru, Rh, Pd, Os, Ir, Ag, W, Sn, Fe, Ni, Li, a combination thereof, or other suitable materials may be deposited on the isolation layer 102 to form a first electrode 112. The conductive material may be deposited using E-gun evaporation, sputtering, electroplating, screen printing or other suitable methods. In some embodiments, the first electrode 112 has a thickness between about 20 nm and about 500 nm.

Figure 8B:
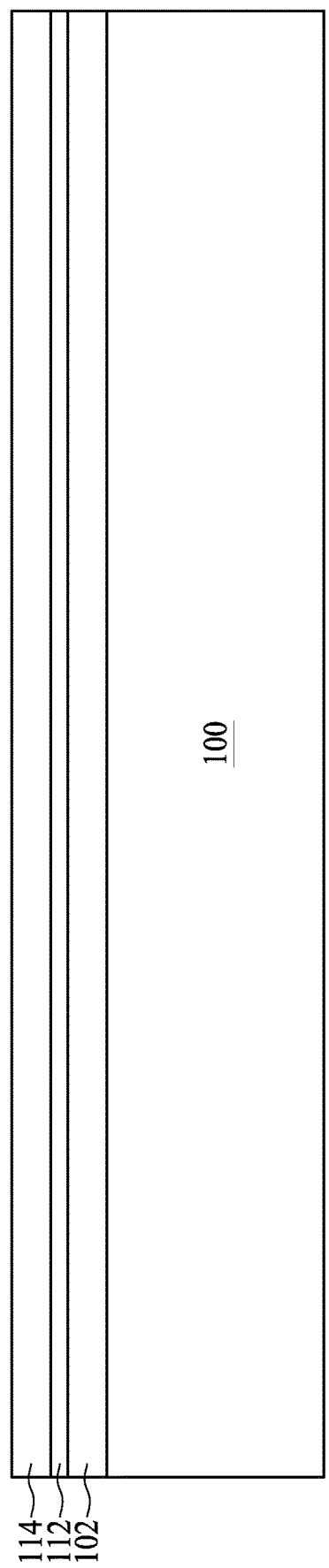

Referring to FIG. 8B, a piezoelectric film 114 is deposited on the first electrode 112 using sol-gel methods, physical vapor deposition (PVD), CVD, electroplating, screen-printing or other suitable methods. In some embodiments, the piezoelectric film 114 includes quartz single crystals, piezoelectric ceramics such as lithium niobate, gallium arsenide, zinc oxide, aluminum nitride and lead zirconate-titanate (PZT), polymer-film piezoelectrics, such as polyvinylidene fluoride (PVDF), or the like. In some embodiments, the piezoelectric film 114 has a thickness between about 100 nm and about 2000 nm.

Figure 8C:
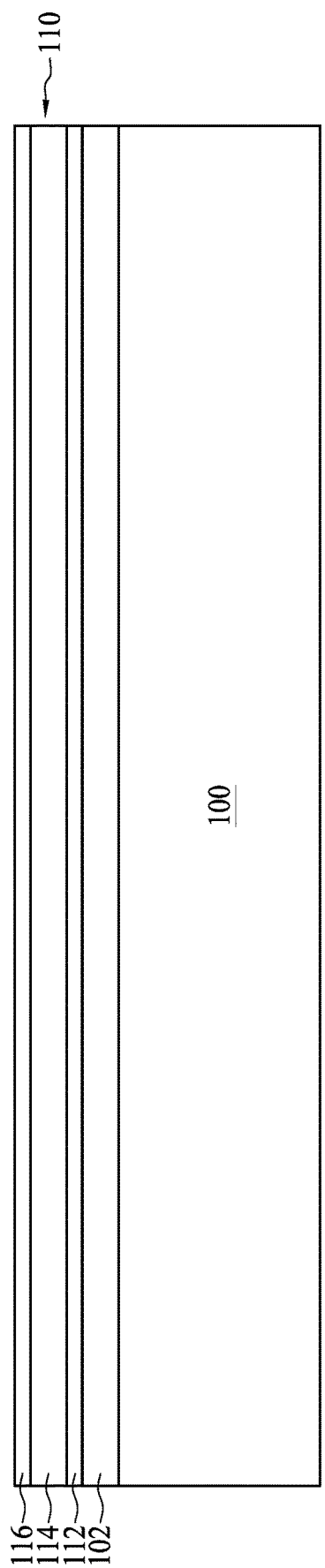

Referring to FIG. 8C, a second electrode 116 is formed on the piezoelectric film 114 using a similar method for forming the first electrode 112. In some embodiments, the second electrode 116 is made of the same material as the first electrode 112. In some embodiments, the second electrode 116 has a thickness between about 20 nm and about 500 nm. The first electrode 112, the second electrode 116 and the piezoelectric film 114 sandwiched by the first electrode 112 and the second electrode 116 may form the piezoelectric structure 110. The first electrode 112 may serve as a bottom electrode or a top electrode of the piezoelectric structure 110, and the second electrode 116 may serve as a top electrode or a bottom electrode of the piezoelectric structure 110.

Figure 8D:
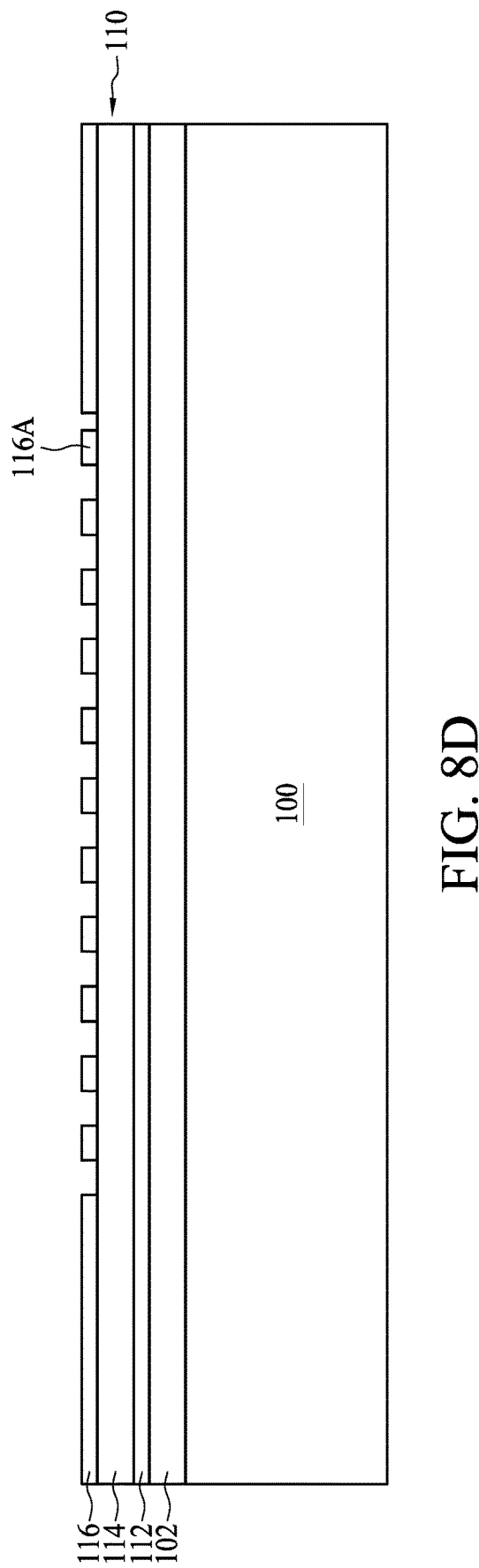

Referring to FIG. 8D, a portion of the second electrode 116 may be optionally patterned to form multiple island electrodes 116A. In some embodiments, the second electrode 116 is patterned using a lift-off technique or an etching operation such as wet etching, ion beam etching, reactive ion etching (RIE) or other suitable methods. In some embodiments, the second electrode 116 is patterned at a temperature between about 20° C. and about 100° C. After a portion of the second electrode 116 is converted to the island electrodes 116A, portions of the piezoelectric film 114 may be exposed by space between two of neighboring island electrodes 116A.

Figure 9:
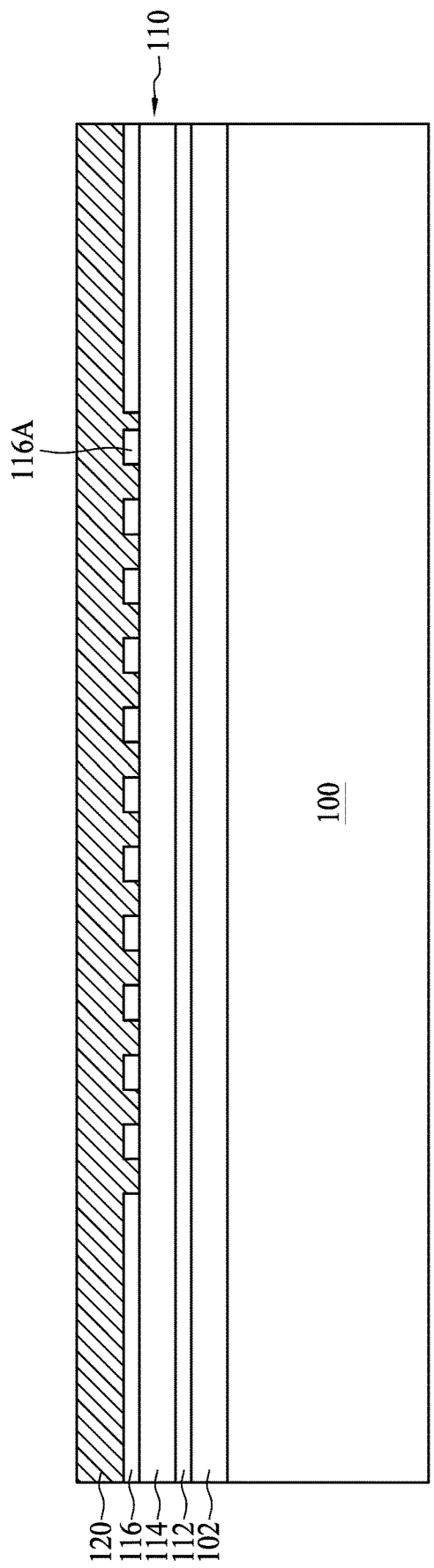

In operation 207, a membrane 120 is formed on the piezoelectric structure 110, as shown in FIG. 9. In some embodiments, the membrane 120 is made of polycrystalline silicon, amorphous silicon, $SiO_2$, $Al_2O_3$, $Ta_2O_5$, $HfO_2$, $Si_3N_4$, $Y_2O_3$, $ZrO_2$, $TiO_2$, $La_2O_3$, a combination thereof, or other suitable materials. The membrane 120 may be a monolayer film made of a single material or a multilayer film made of composite materials. The membrane 120 may be formed using CVD, PVD, atomic layer deposition (ALD) or other suitable methods. In some embodiments, the membrane 120 has a thickness between about 100 nm and about 10000 nm.

Figure 10:
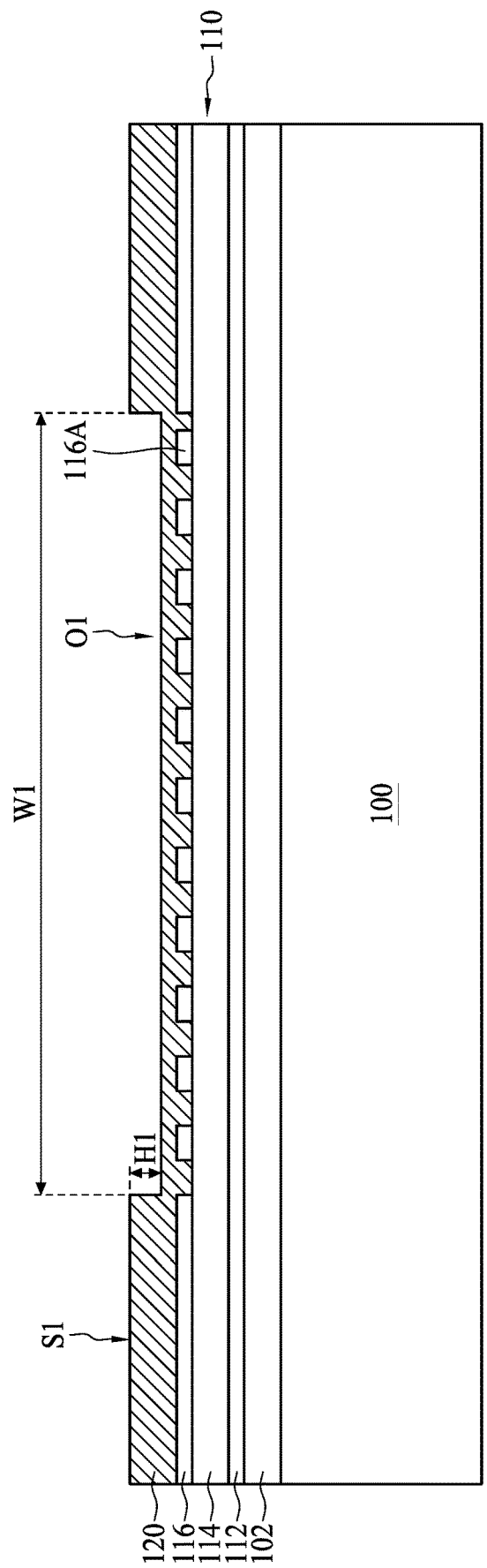

In operation 209, a cavity O1 is formed in the membrane 120, as shown in FIG. 10. The cavity O1 may be formed using an etching operation such as wet etching, ion beam etching, RIE or other suitable methods. In some embodiments, the cavity O1 is formed at a temperature between about 20° C. and about 100° C. The cavity O1 may have a depth H1 from a top surface S1 of the membrane 120. In some embodiments, a width of the cavity O1 is corresponding to the island electrodes 116A. According to different materials used for forming the membrane 120, the depth H1 of the cavity O1 can be controlled by adjusting the etching time or etching rate. In some embodiments, the cavity O1 is disposed on one side of the membrane 120, and the second electrode 116 or the island electrodes 116A are disposed on the other side of the membrane 120.

Figure 11:
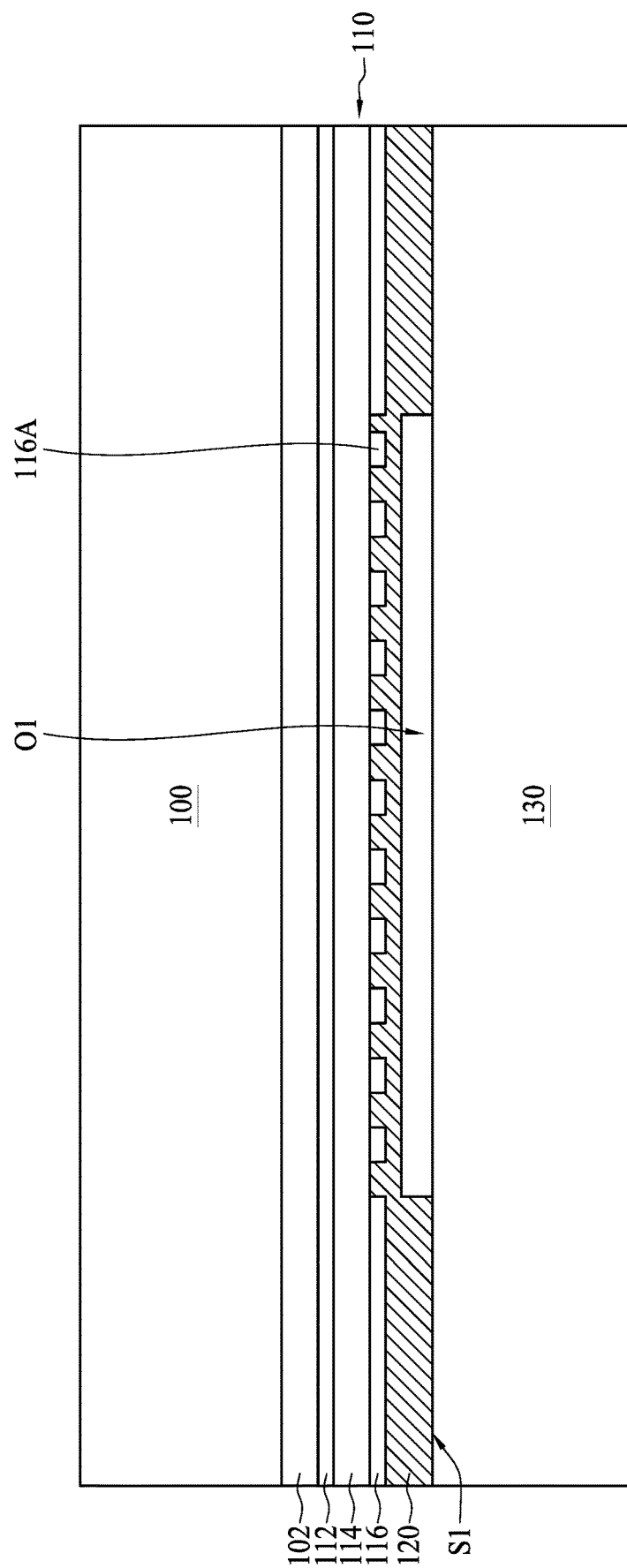

In operation 211, the membrane 120 is bonded to a carrier 130, as shown in FIG. 11. The carrier 130 may be attached to the top surface S1 of the membrane 120 such that the cavity O1 is enclosed by the carrier 130 and the membrane 120. In some embodiments, the carrier 130 is bonded to the membrane 120 using fusion bonding at a temperature between about 20° C. and about 300° C. or other suitable bonding methods. In some embodiments, the inside of the cavity 130 is vacuum.

Figure 12:
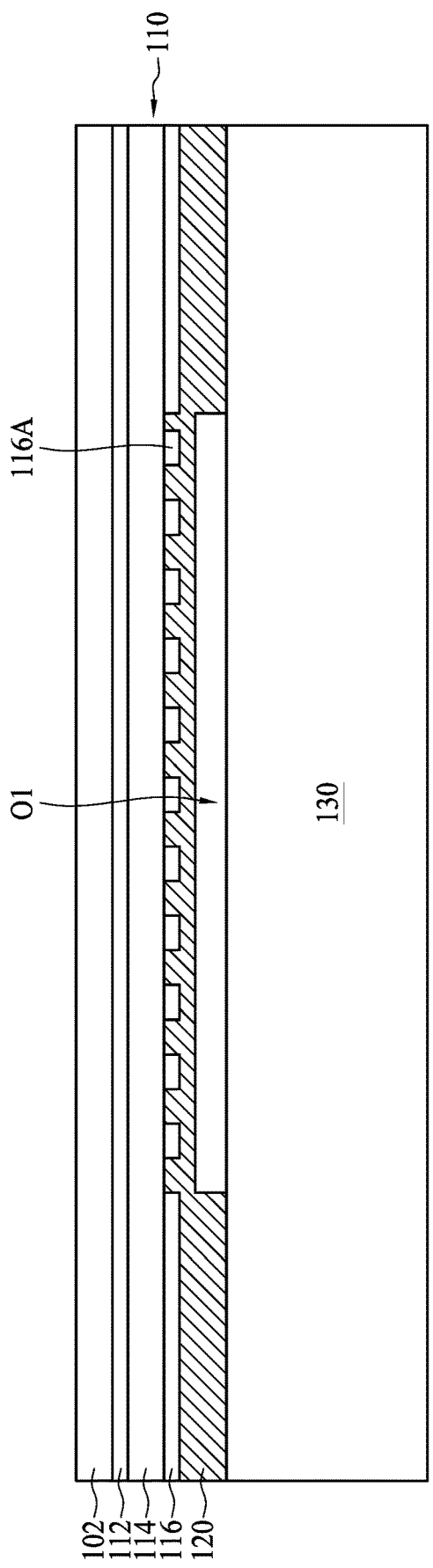
Figure 13:
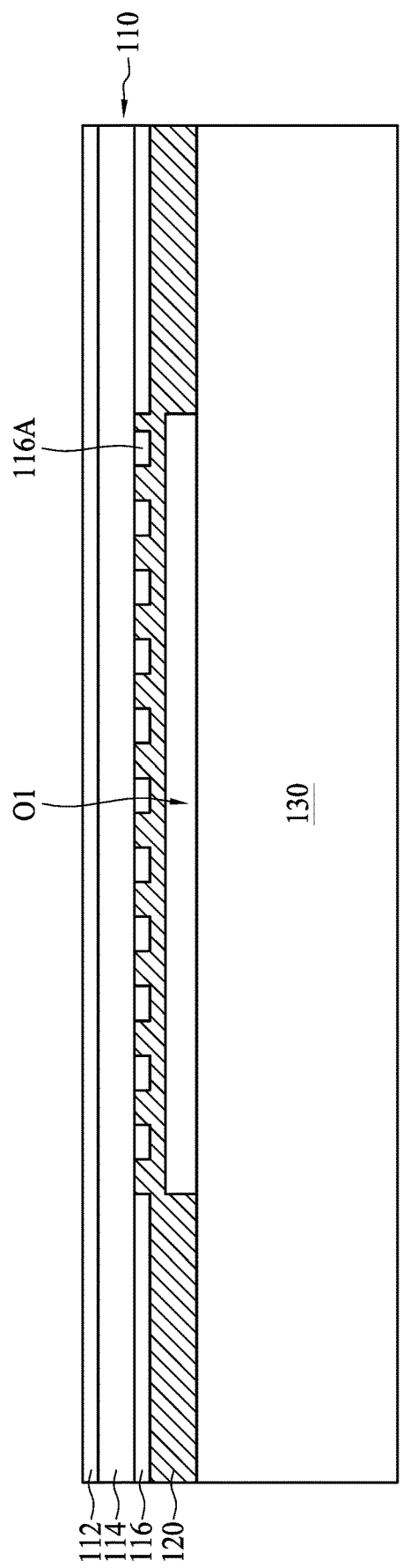

In operation 213, the handle substrate 100 and the isolation layer 102 are removed, as shown in FIGS. 12 and 13. Referring to FIG. 12, the handle substrate 100 may be removed using chemical mechanical polishing (CMP), wafer grinding, wet etching or other suitable methods. The removal of the handle substrate 100 may be performed at a temperature between about 20° C. and about 100° C. Referring to FIG. 13, the isolation layer 102 may be removed using a lift-off technique or an etching operation such as wet etching, ion beam etching, RIE or other suitable methods. The removal of the isolation layer 102 may be performed at a temperature between about 20° C. and about 100° C.

Figure 14:
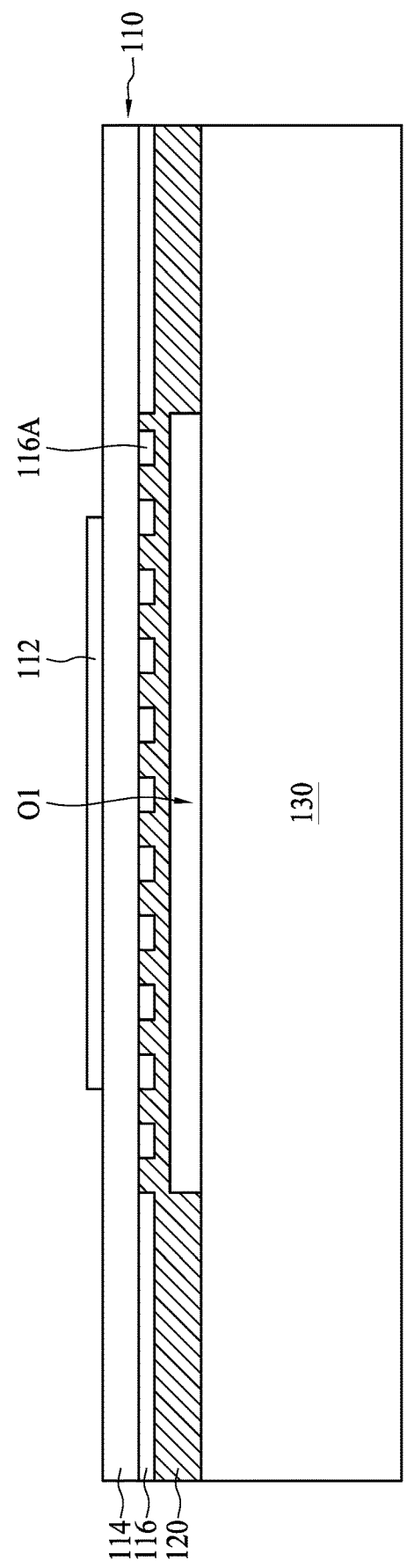

In operation 215, the first electrode 112 of the piezoelectric structure 110 is patterned, as shown in FIG. 14. In some embodiments, portions of the first electrode 112 are removed. In some embodiments, the remaining first electrode 112 is over and corresponding to the island electrodes 116A or the cavity O1. The first electrode 112 may be patterned using a lift-off technique or an etching operation such as wet etching, ion beam etching, RIE or other suitable methods. In some embodiments, the first electrode 112 is patterned at a temperature between about 20° C. and about 100° C.

Figure 15:
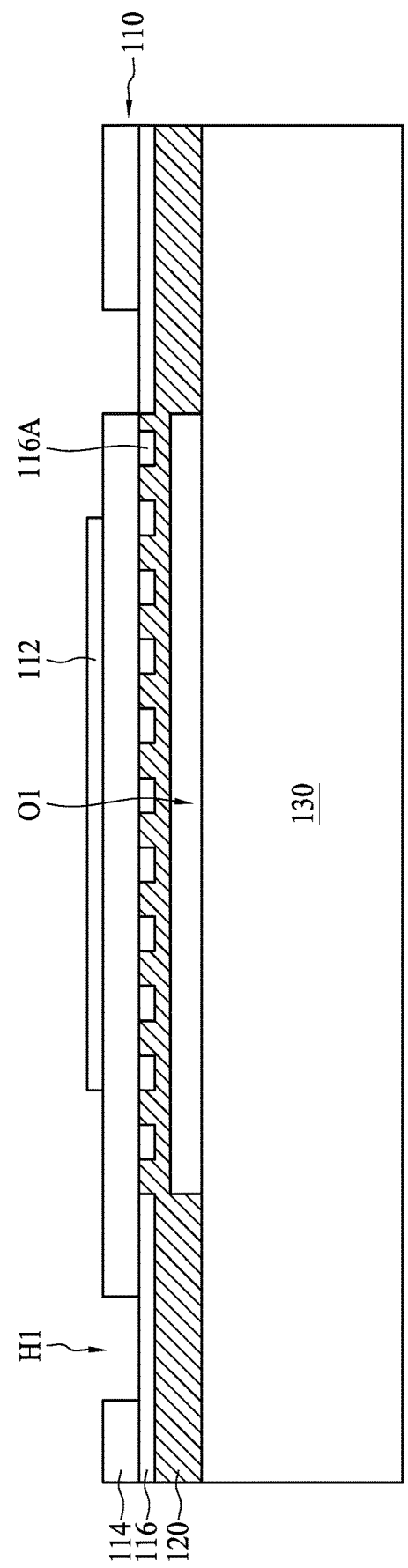

In operation 217, the piezoelectric film 114 of the piezoelectric structure 110 is patterned to form multiple holes H1, as shown in FIG. 15. In some embodiments, portions of the piezoelectric film 114 are removed to form the holes H1 that expose portions of the underlying second electrode 116. The holes H1 may be formed using an etching operation such as wet etching, ion beam etching, RIE or other suitable methods. In some embodiments, the piezoelectric film 114 is patterned at a temperature between about 20° C. and about 100° C.

Figure 16:
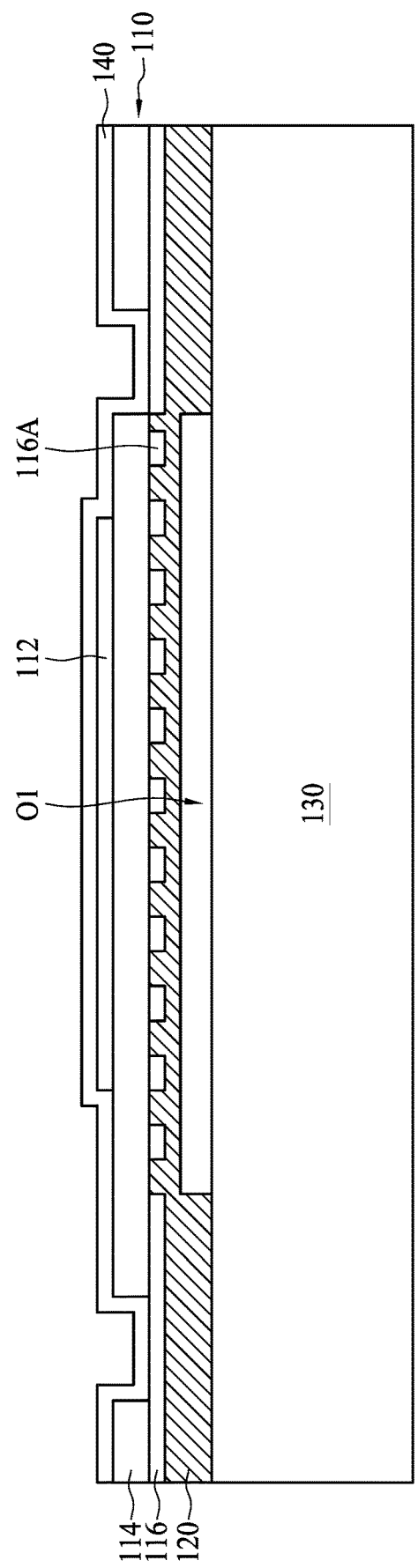

In operation 219, a dielectric layer 140 is conformally formed on the first electrode 112, the piezoelectric film 114 and the second electrode 116 of the piezoelectric structure 110, as shown in FIG. 16. In some embodiments, the dielectric layer 140 includes $SiO_2$, $Al_2O_3$, $Ta_2O_5$, $HfO_2$, $Si_3N_4$, $Y_2O_3$, $ZrO_2$, $TiO_2$, $La_2O_3$, a combination thereof, or other suitable materials. The membrane 120 may be a monolayer film made of a single material or a multilayer film made of composite materials. The dielectric layer 140 may be formed using CVD, PVD, ALD or other suitable methods. In some embodiments, the dielectric layer 140 has a thickness between about 100 nm and about 10000 nm.

Figure 17:
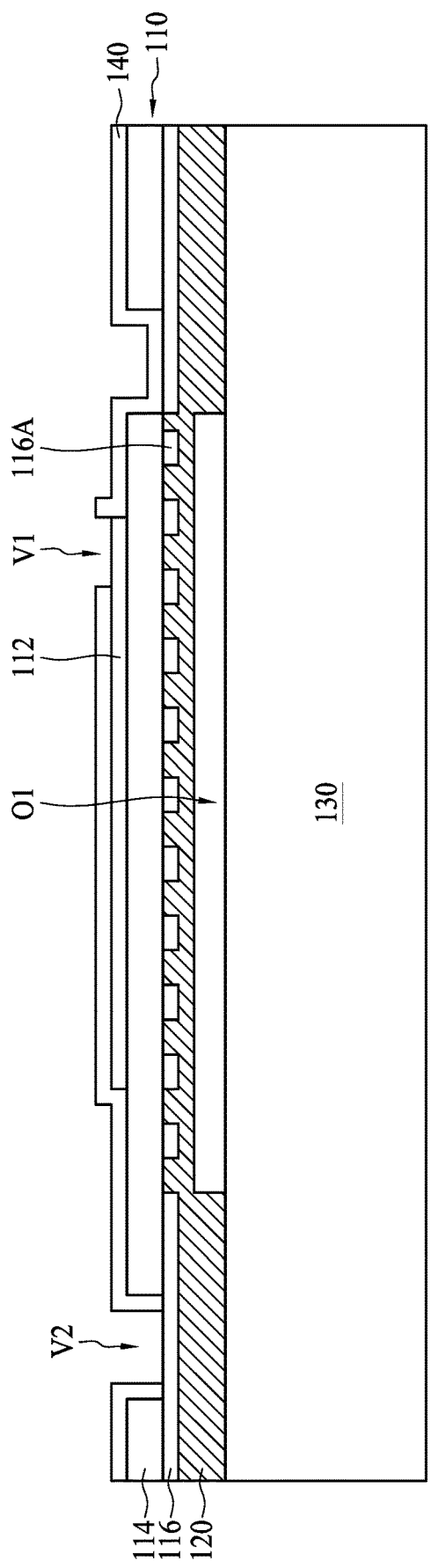

In operation 221, the dielectric layer 140 is patterned to form multiple vias V1 and V2, as shown in FIG. 17. In some embodiments, a portion of the dielectric layer 140 is removed to form the via V1 that exposes a portion of the underlying first electrode 112. In some embodiments, another portion of the dielectric layer 140 is removed to form the via V2 that exposes a portion of the underlying second electrode 116. The vias V1 and V2 may be formed using an etching operation such as wet etching, ion beam etching, RIE or other suitable methods. In some embodiments, the dielectric layer 140 is patterned at a temperature between about 20° C. and about 100° C.

Figure 18:
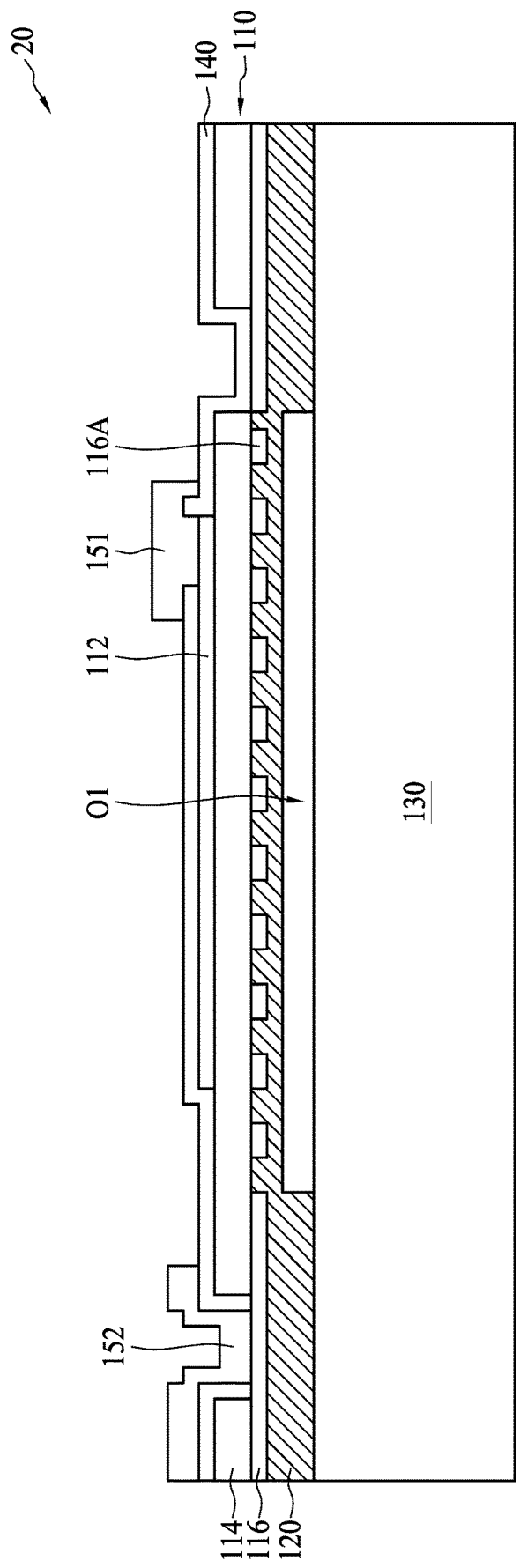

In operation 223, conductive features 151 and 152 are respectively formed in the vias V1 and V2, as shown in FIG. 18. A conductive material such as Pt, Au, Zn, Cu, Al, Ru, Rh, Pd, Os, Ir, Ag, W, Sn, Fe, Ni, Li, a combination thereof, or other suitable materials may be deposited on the dielectric layer 140 and filled into the vias V1 and V2. The conductive material may be deposited using E-gun evaporation, sputtering, electroplating, screen printing or other suitable methods. Portions of the conductive material may then be removed using a lift-off technique or an etching operation such as wet etching, ion beam etching, RIE or other suitable methods to form the conductive features 151 and 152. In some embodiments, the conductive features 151 and 152 are formed at a temperature between about 20° C. and about 400° C. In some embodiments, the conductive feature 151 or 152 has a thickness between about 20 nm and about 500 nm. The conductive feature 151 is electrically coupled to the first electrode 112 and the conductive feature 152 is electrically coupled to the second electrode 116 or the island electrodes 116A. The conductive feature 151 may be used to electrically couple the first electrode 112 to other circuits that are subsequently formed. The conductive feature 152 may be used to electrically couple the second electrode 116 or the island electrodes 116A to other circuits that are subsequently formed. Input/output (I/O) pads (not shown) may be disposed on and electrically coupled to the conductive features 151 and 152. At this stage, the PMUT device 20 is formed. The central portion of the PMUT device 20 corresponding to the cavity O1 may function as an actuator of the PMUT device 20 for functioning sensing, actuation or imaging. The conductive features 151 and 152 may function as a sensor of the PMUT device 20. The actuator may be surrounded by the sensor.

Figure 19:
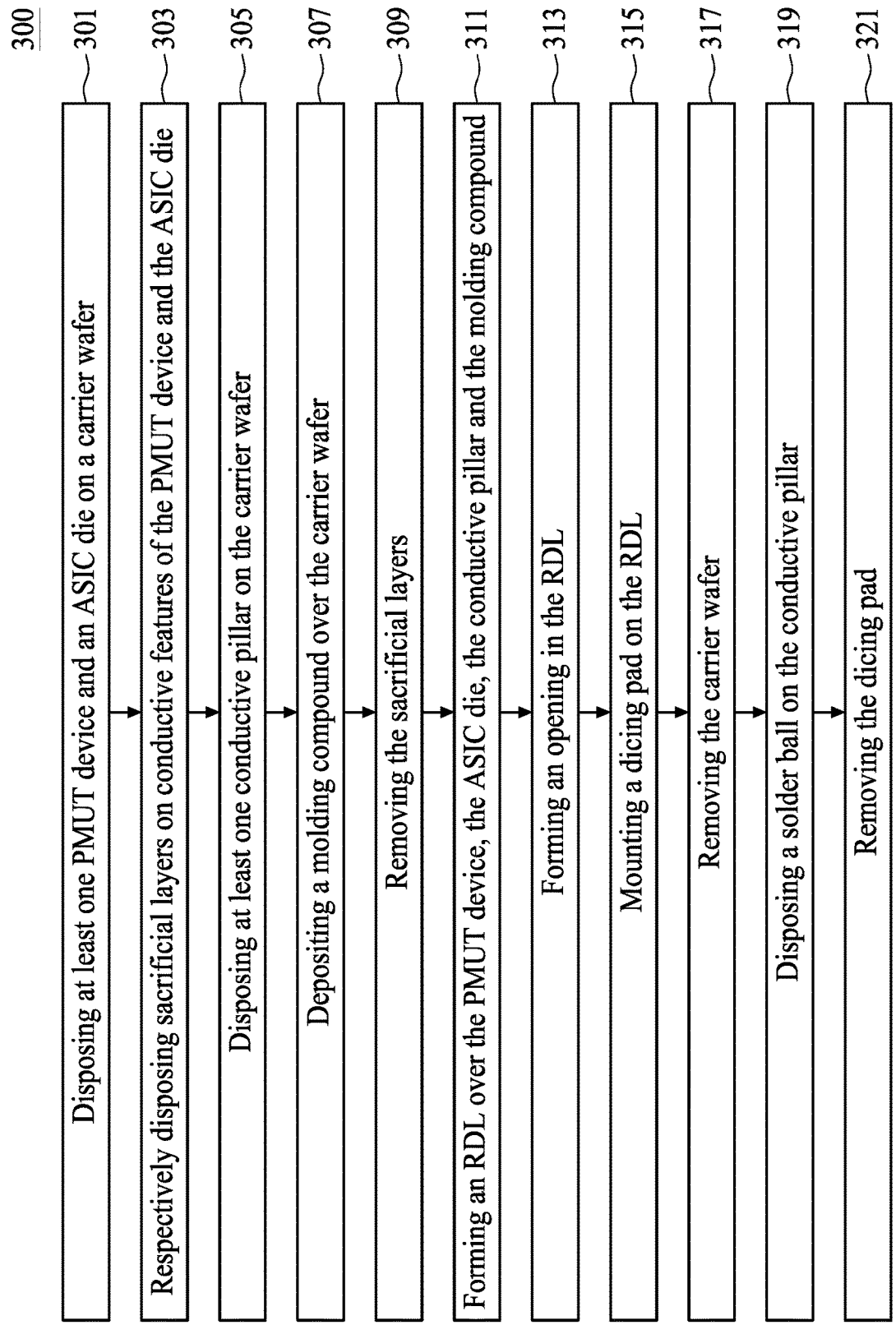
FIG. 19 is a flow diagram showing a method of fabricating a semiconductor device.

FIG. 19 is a flow diagram showing a method 300 of fabricating a semiconductor device 50. FIGS. 20 to 33 are schematic cross-sectional views illustrating sequential operations of the method 300 shown in FIG. 19.

Figure 20:
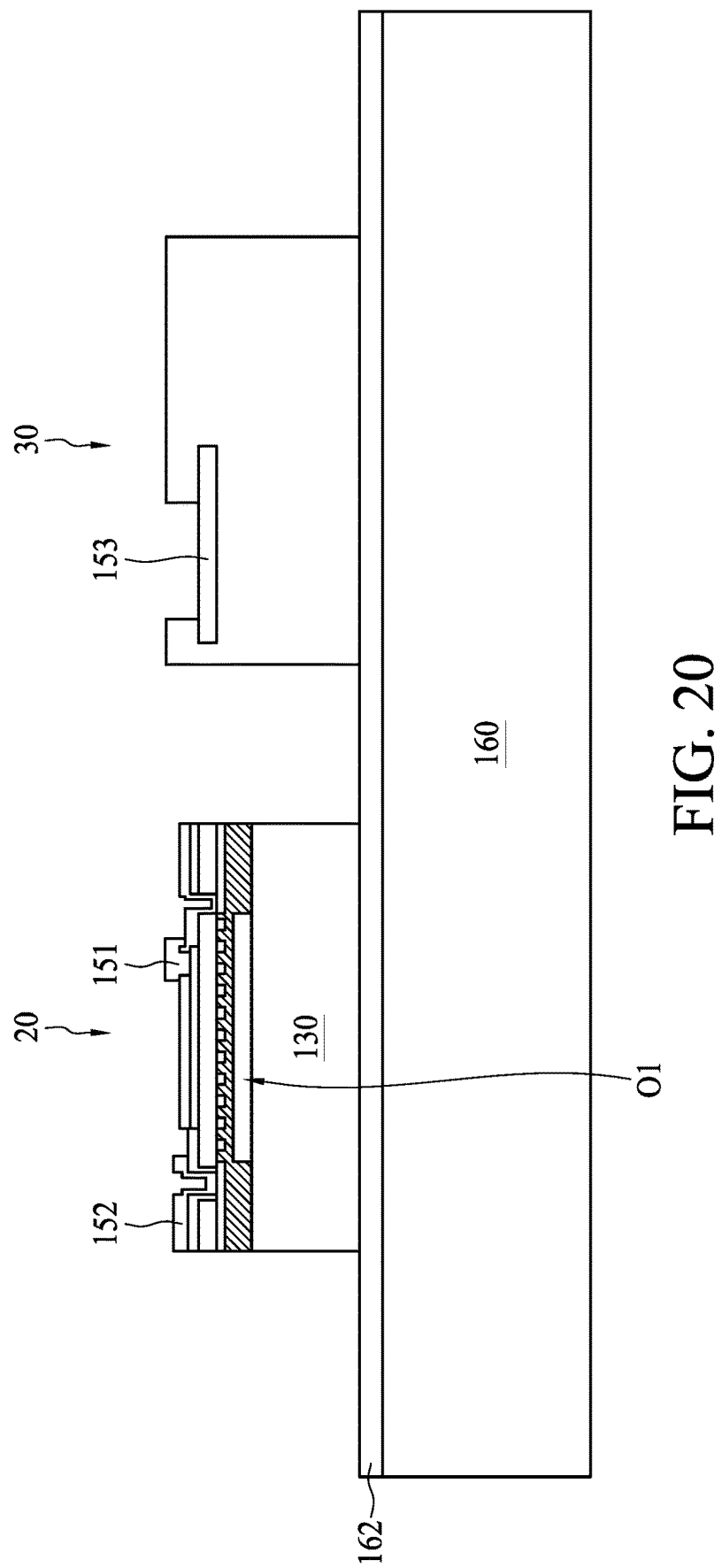
FIGS. 20 to 22, 23A to 23B, 24 to 32 are schematic cross-sectional views illustrating sequential operations of the method shown in FIG. 19.

In operation 301, at least one PMUT device 20 and an application specific integrated circuit (ASIC) die 30 are disposed on a carrier wafer 160, as shown in FIG. 20. The carrier wafer 160 may be made of glass, ceramics or other suitable materials. The number of PMUT devices 20 disposed on the carrier wafer 160 may depend on the size of each PMUT device 20 and the size of the carrier wafer 160, or any particular application, for example. In some embodiments, the ASIC die 30 is disposed adjacent to the PMUT device 20. The ASIC die 30 may include a digital signal processing (DSP) chip, a driver or a decoder. The ASIC die 30 may include at least a conductive feature 153 for electrically coupling to other elements. A pick and place machine may be used to place the PMUT device 20 and the ASIC die 30 in predetermined locations on the carrier wafer 160. In some embodiments, some of the PMUT devices 20 are replaced by capacitive micromachined ultrasonic transducer (CMUT) devices. In such embodiments, both PMUT devices and CMUT devices are disposed on the carrier wafer 160 and adjacent to the ASIC die 30.

Still referring to FIG. 20, in some embodiments, a die attach film (DAF) 162 is disposed on the carrier wafer 160 before the PMUT device 20 and the ASIC die 30 are disposed. The DAF 162 may include a polymer such as polyimide (PI) or a thermoplastic material. The DAF 162 may be liquid, e.g., a thick liquid, when applied but forms a solid at room temperature, and may become semi-liquid when heated and may become sticky to function as an adhesive at elevated temperatures. The DAF 162 may be in contact with the PMUT device 20 and the ASIC die 30.

Figure 21:
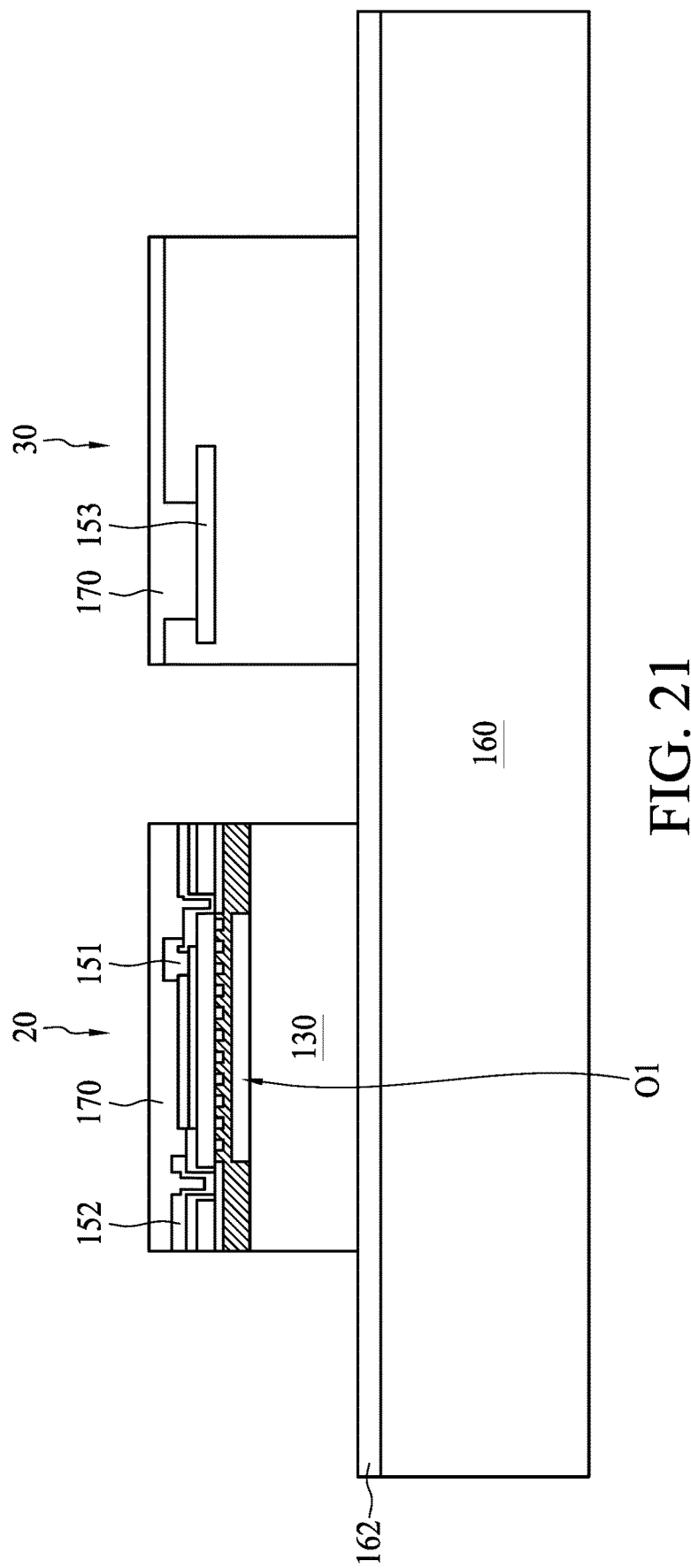

In operation 303, sacrificial layers 170 are respectively disposed on the conductive features 151 and 152 of the PMUT device 20 and the conductive feature 153 of the ASIC die 30, as shown in FIG. 21. In some embodiments, the sacrificial layers 170 are made of polymers. The sacrificial layers 170 may be used to protect the conductive features 151 and 152 of the PMUT device 20 and the conductive feature 153 of the ASIC die 30 from contamination prior to subsequent operations.

Figure 22:
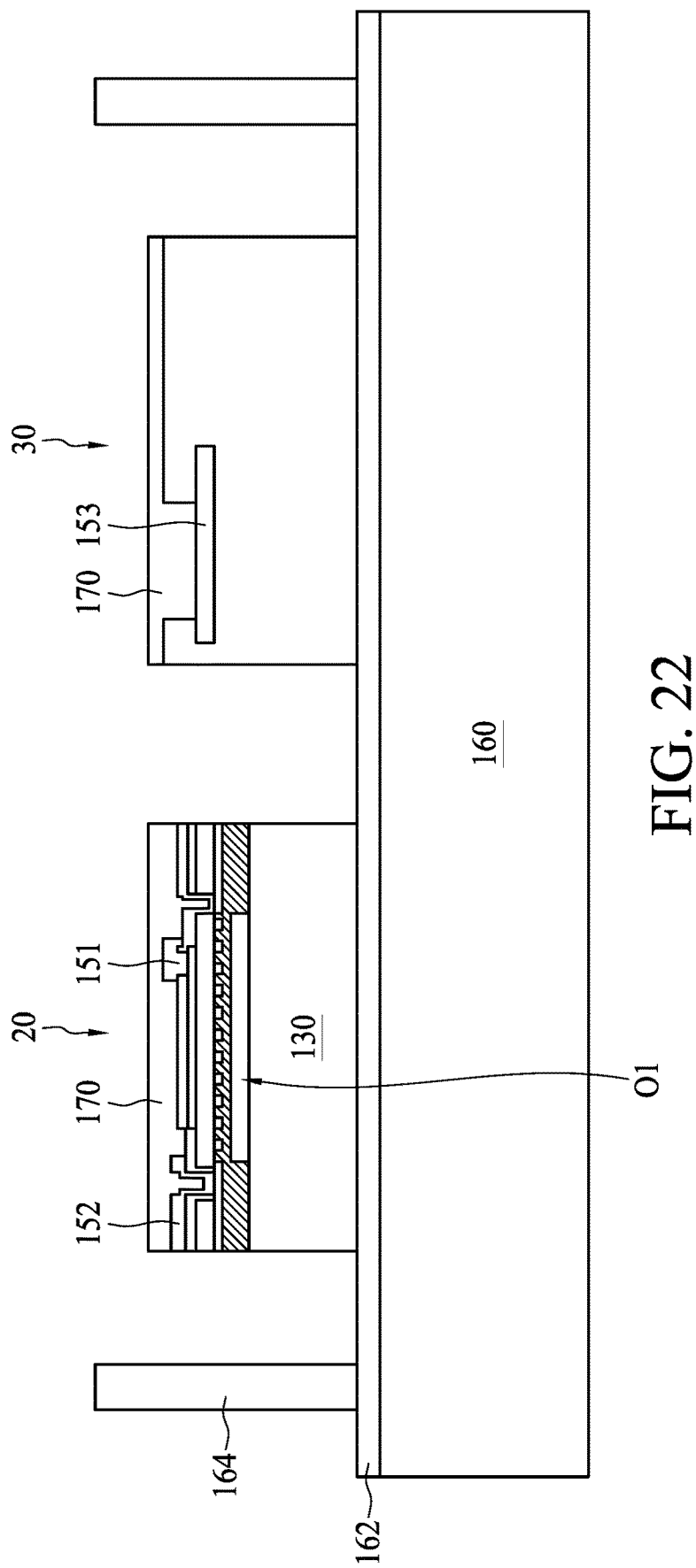

In operation 305, at least one conductive pillar 164 is disposed on the carrier wafer 160, as shown in FIG. 22. The conductive pillar 164 may be a through integrated fan-out (InFO) via (TIV). The conductive pillar 164 may be formed by a series of deposition, lithographic and etching operations over the carrier wafer 160. The conductive pillar 164 may be made of a conductive material such as Pt, Au, Zn, Cu, Al, Ru, Rh, Pd, Os, Ir, Ag, W, Sn, Fe, Ni, Li, W, a combination thereof, or other suitable materials. In some embodiments, the conductive pillar 164 is disposed adjacent to the PMUT device 20 or the ASIC die 30.

Figure 23A:
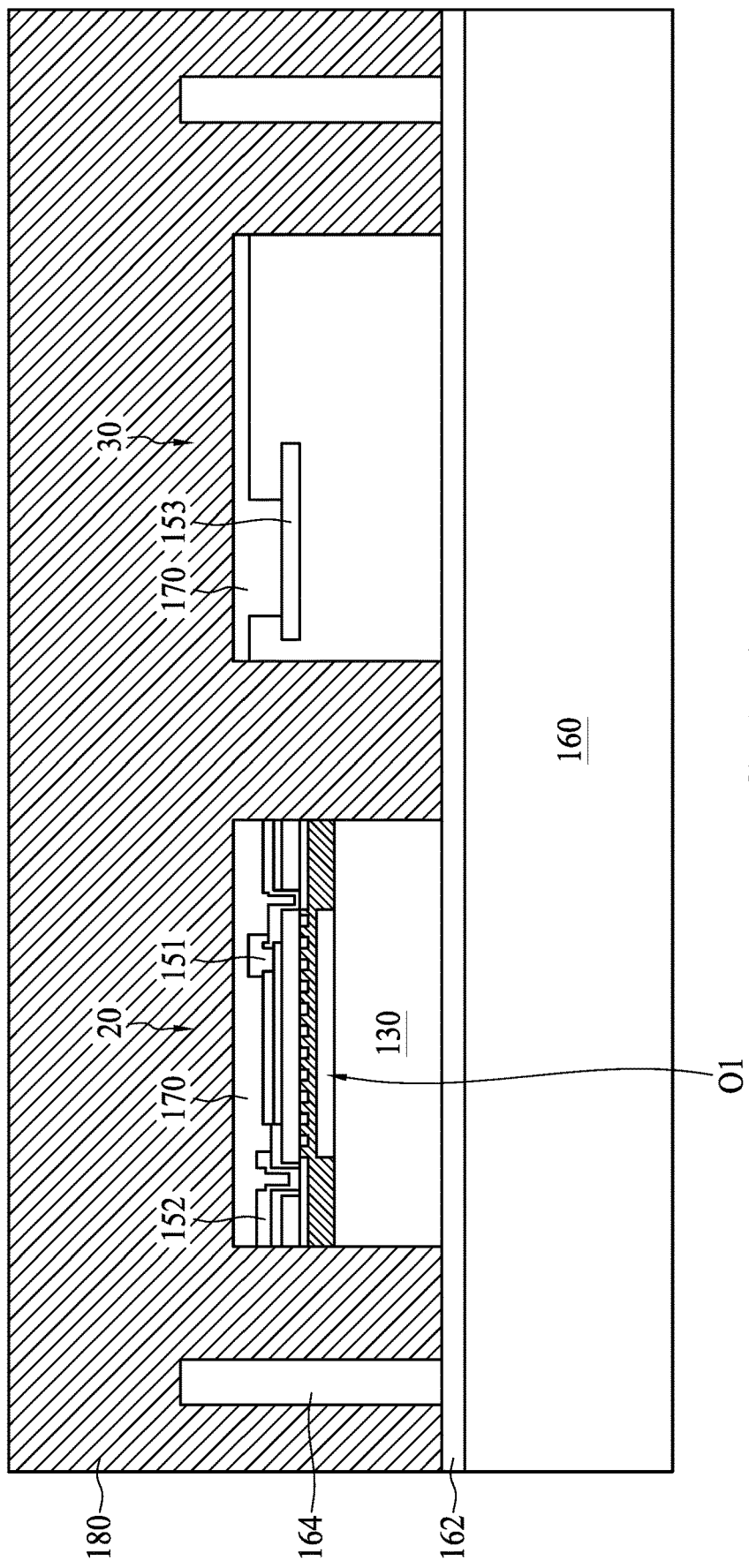
Figure 23B:
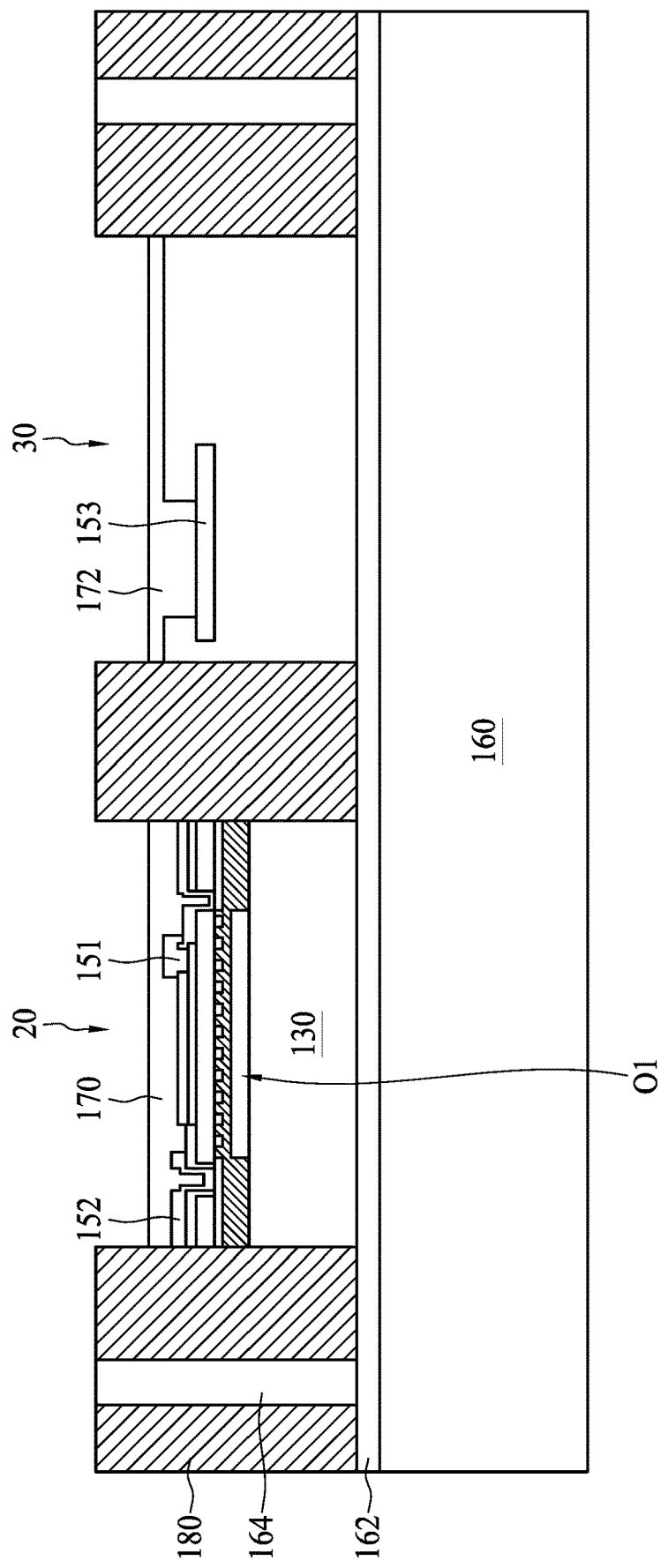

In operation 307, a molding compound 180 is deposited over the carrier wafer 160, as shown in FIGS. 23A and 23B. The molding compound 180 may include components such as epoxy resins, curing agents, catalysts, fillers, pigments and additives. Referring to FIG. 23A, the molding compound 180 is formed over and surrounding the PMUT device 20, the ASIC die 30 and the conductive pillar 164. The molding compound 180 may fill into gaps between the conductive pillar 164 and the PMUT device 20, between the PMUT device 20 and the ASIC die 30 and between the conductive pillar 164 and the ASIC die 30. The molding compound 180 may cover exposed portions of the DAF 162. The top surface of the molding compound 180 may be higher than the top surface of the PMUT device 20. Referring to FIG. 23B, portions of the molding compound 180 over the PMUT device 20 and the ASIC die 30 are removed such that the sacrificial layers 170 are exposed. The top surface of the molding compound 180 may be substantially coplanar with the top surface of the conductive pillar 164.

Figure 24:
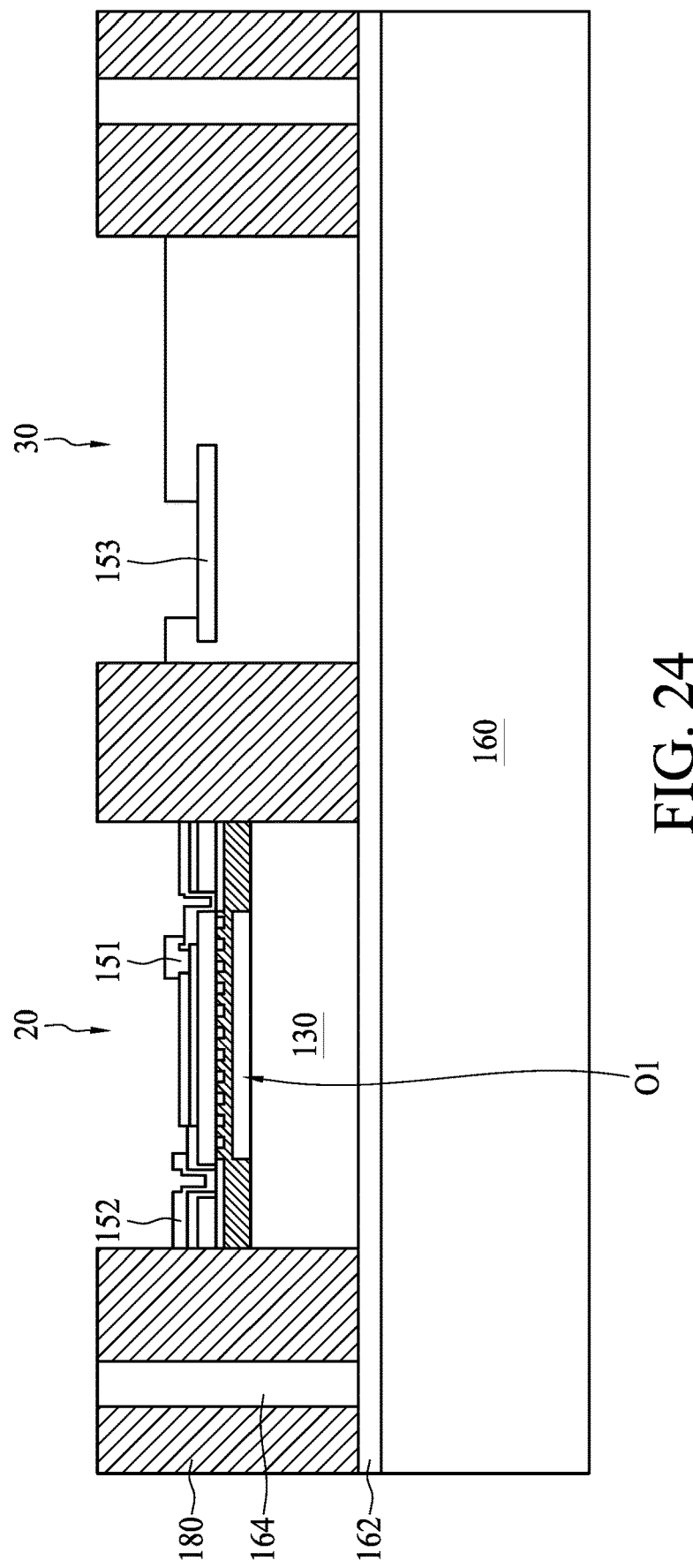

In operation 309, the sacrificial layers 170 are removed, as shown in FIG. 24. The conductive features 151, 152 and 153 are exposed after the removal of the sacrificial layers 170.

Figure 25:
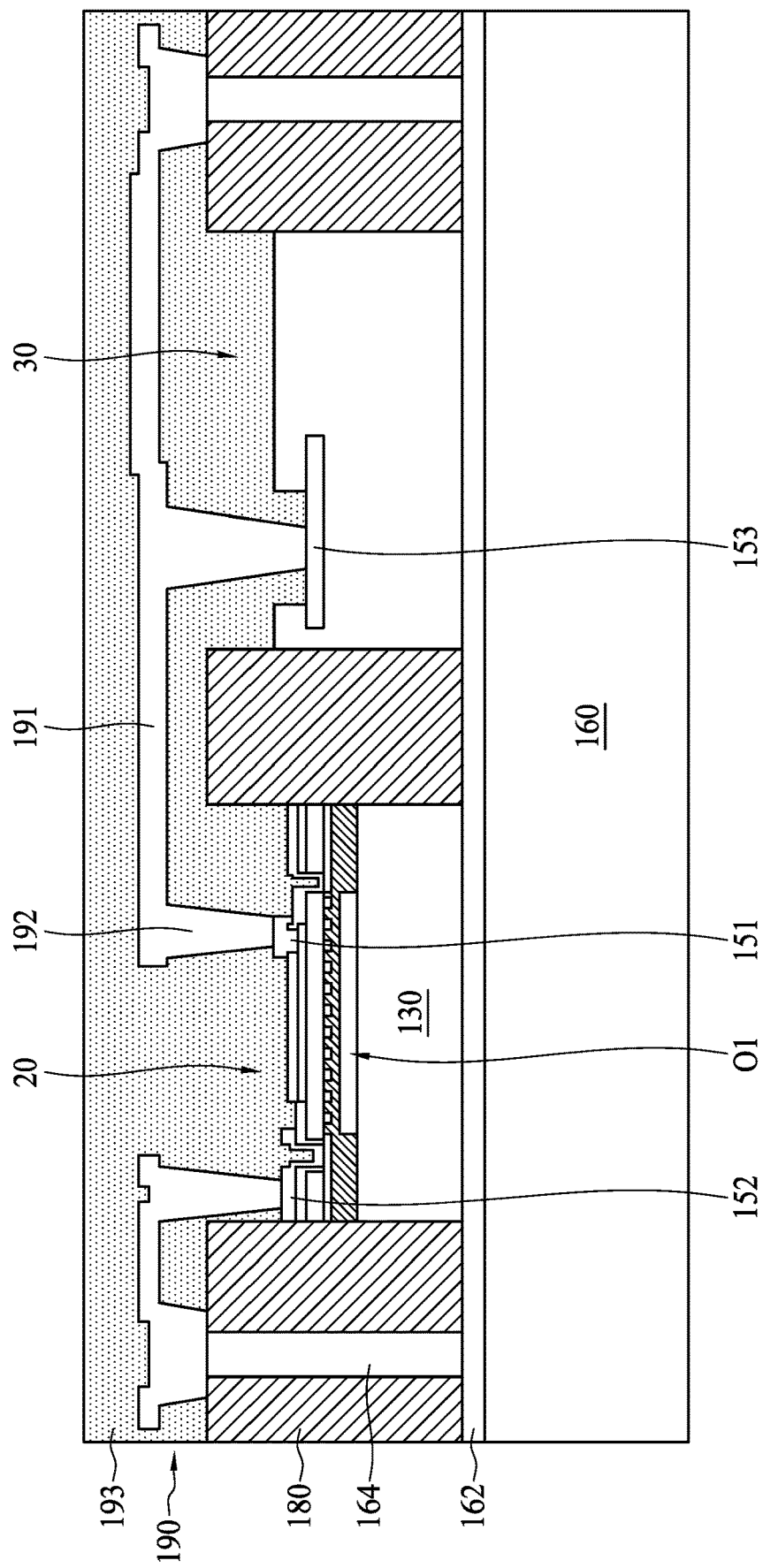

In operation 311, a redistribution layer (RDL) 190 is formed over the PMUT device 20 (or a CMUT device), the ASIC die 30, the conductive pillar 164 and the molding compound 180, as shown in FIG. 25. The RDL 190 includes multiple connected horizontal wires 191 and vertical pillars 192 embedded in an isolation layer 193. The horizontal wires 191 and the vertical pillars 192 may be made of a conductive material such as Pt, Au, Zn, Cu, Al, Ru, Rh, Pd, Os, Ir, Ag, W, Sn, Fe, Ni, Li, W, a combination thereof, or other suitable materials. The isolation layer 193 may include single or multiple layers of polymers such as PI. In some embodiments, some of the vertical pillars 192 are respectively electrically coupled to the conductive features 151, 152 and 153. In some embodiments, some of the vertical pillars 192 are electrically coupled to the conductive pillars 164. The PMUT device 20 (or a CMUT device) may be electrically coupled to the ASIC die 30 through the RDL 190.

Figure 26:
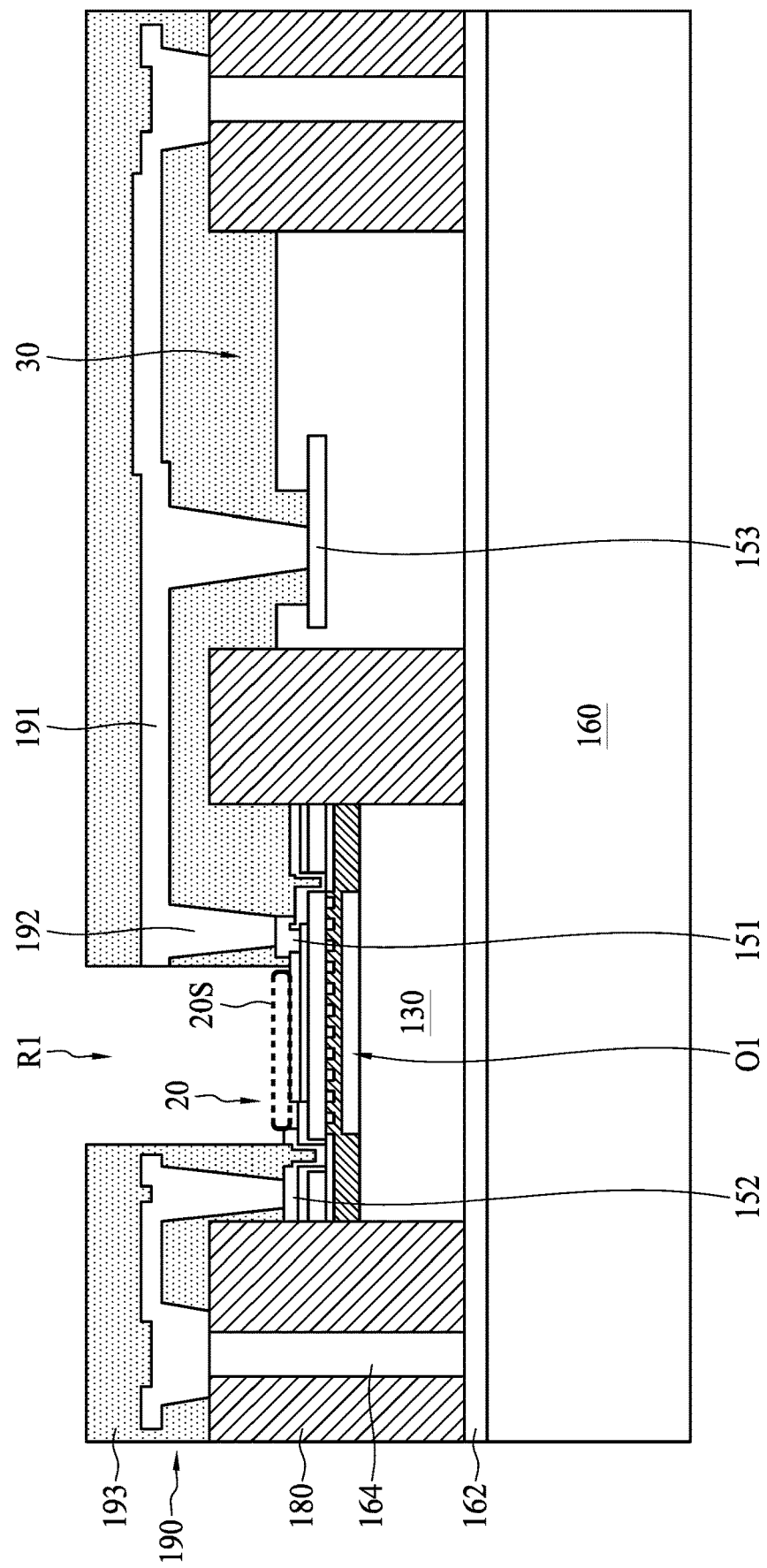

In operation 313, an opening R1 is formed in the RDL 190, as shown in FIG. 26. A portion of the isolation layer 193 may be removed using an etching operation such that a portion of the PMUT device 20 is exposed. In some embodiments, the opening R1 penetrates the RDL 190 and exposes a sensing area 20S over the PMUT device 20. The actuator of PMUT device 20 may be aligned with the sensing area 20S.

Figure 27:
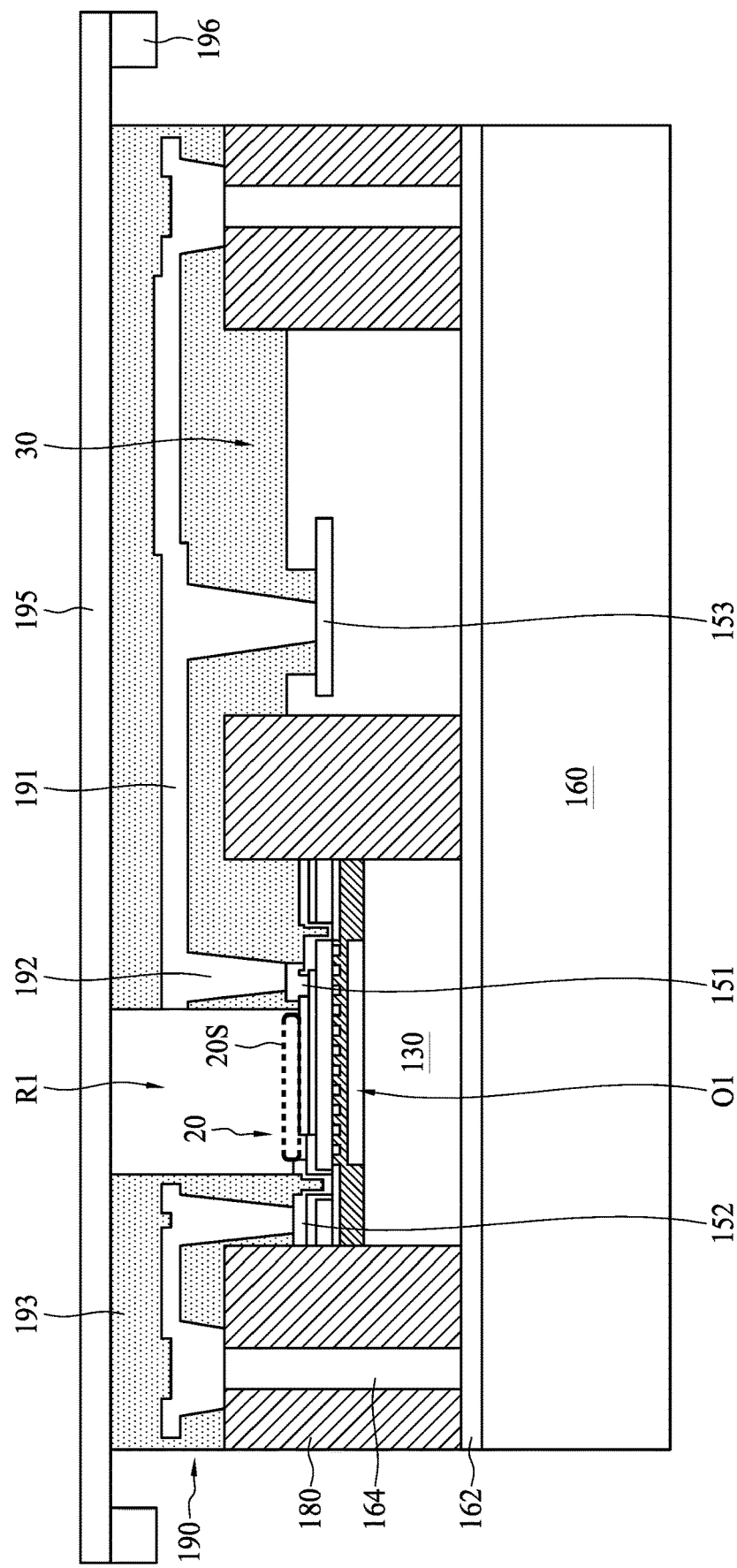

In operation 315, a dicing pad 195 is mounted on the RDL 190, as shown in FIG. 27. A frame 196 may be disposed on the dicing pad 195. The use of the dicing pad 195 and the frame 196 is for a subsequent pick and place operation.

Figure 28:
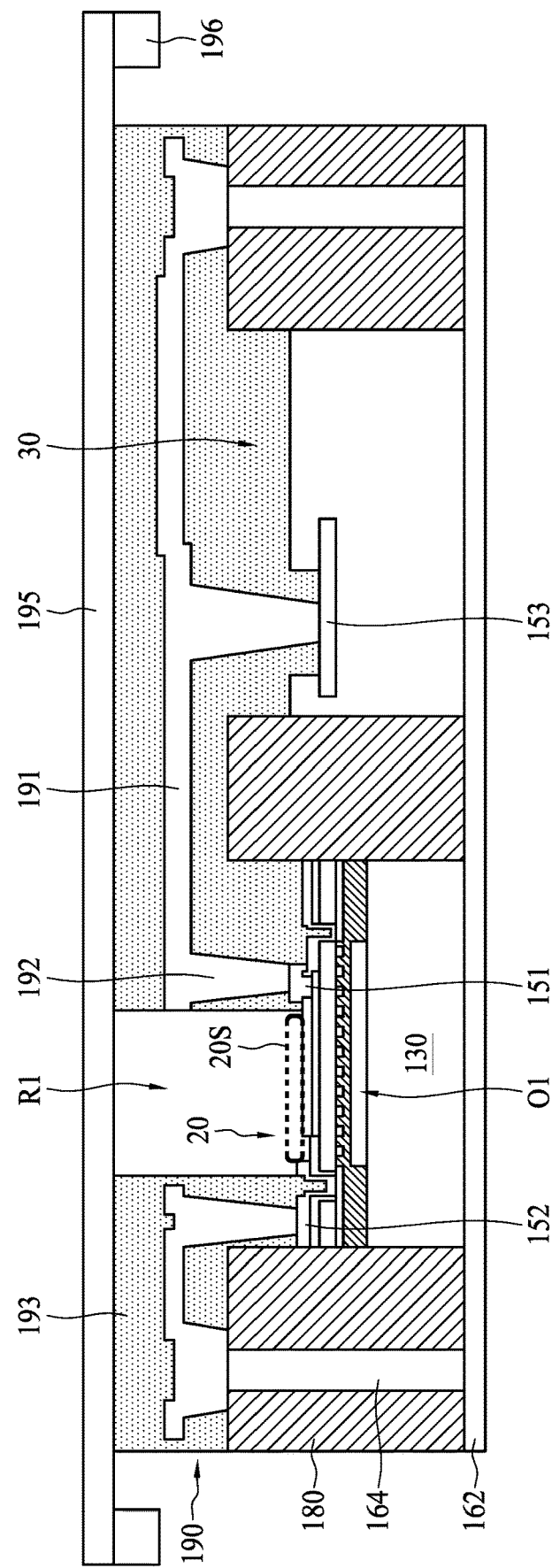

In operation 317, the carrier wafer 160 is removed, as shown in FIG. 28. The carrier wafer 160 may be removed using a debonding operation. The molding compound 180 may support the PMUT device 20 and the ASIC die 30 during the debonding operation.

Figure 29:
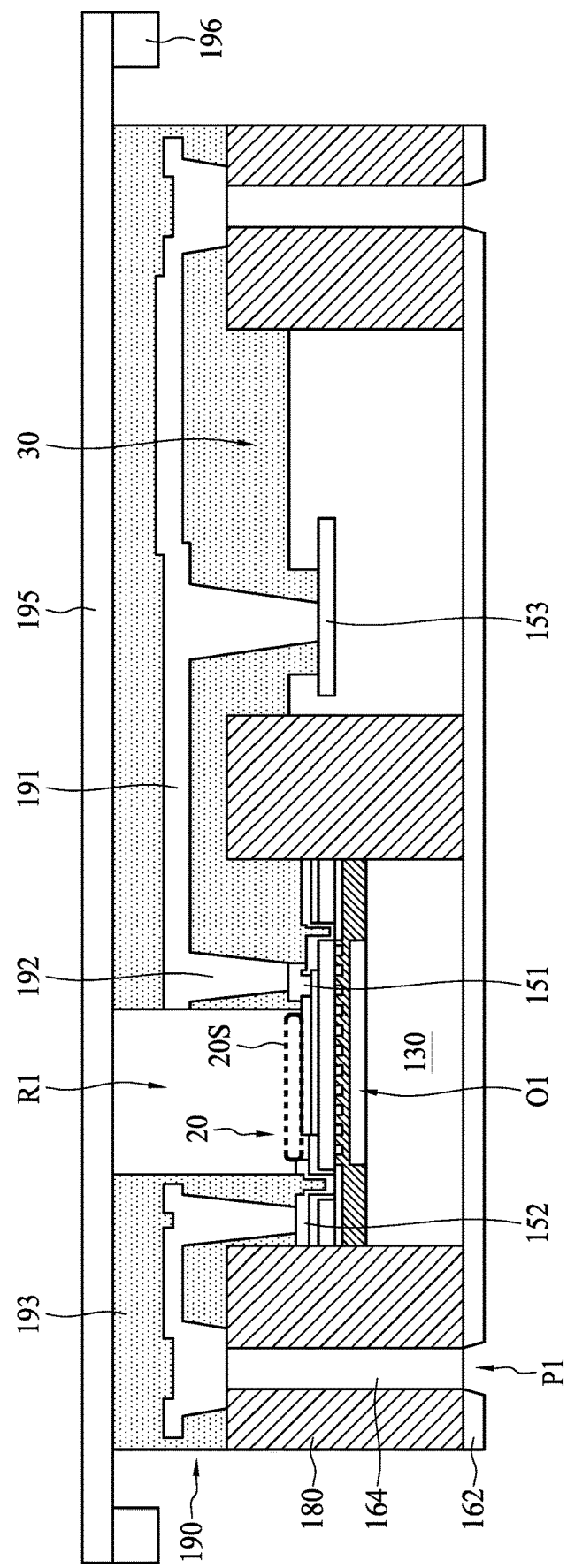
Figure 30:
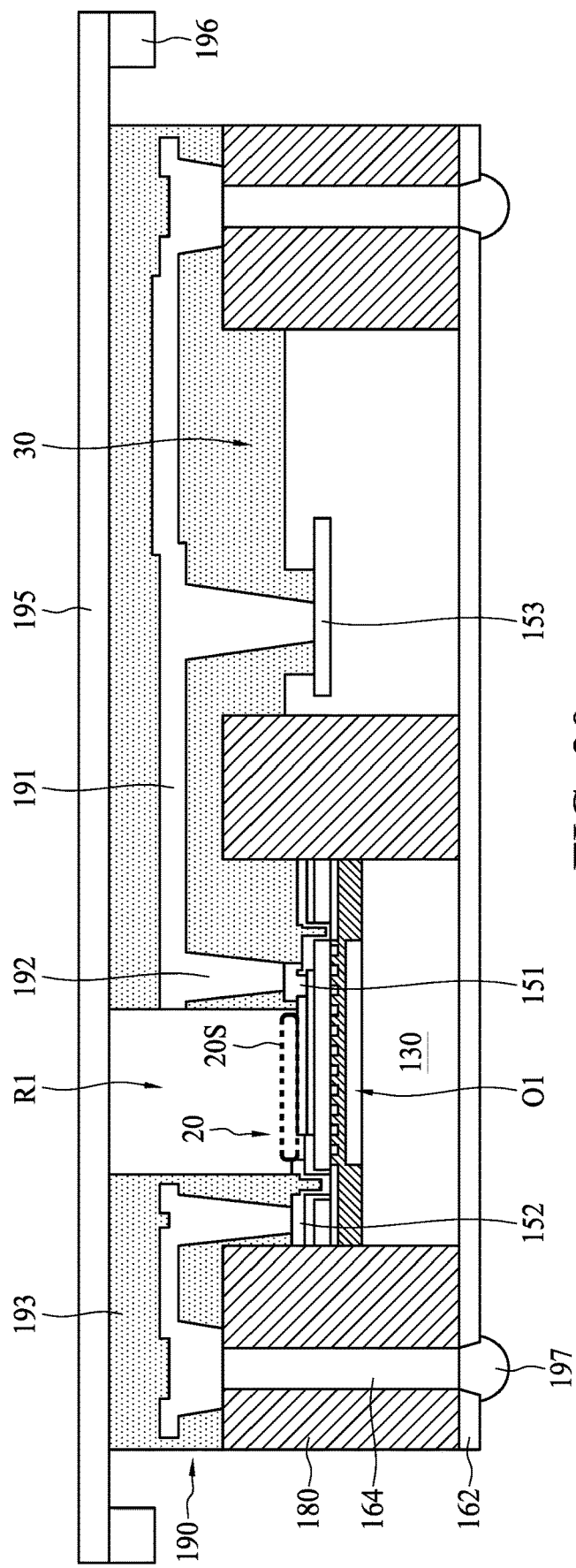

In operation 319, a solder ball 197 is disposed on the conductive pillar 164, as shown in FIGS. 29 and 30. Referring to FIG. 29, an opening P1 is formed in the DAF 162. The opening P1 may be formed using a laser-drilling operation. The opening P1 may penetrate the DAF 162 and expose a portion of the conductive pillar 164. In some embodiments shown in FIG. 29, the DAF 162 is left on the back side of the PMUT device 20. In some other embodiments, the DAF 162 is completely removed after the carrier wafer 160 is removed. Referring to FIG. 30, the solder ball 197 is formed in the opening P1 and contacting the conductive pillar 164. The solder ball 197 may be electrically coupled to the conductive pillar 164.

Figure 31:
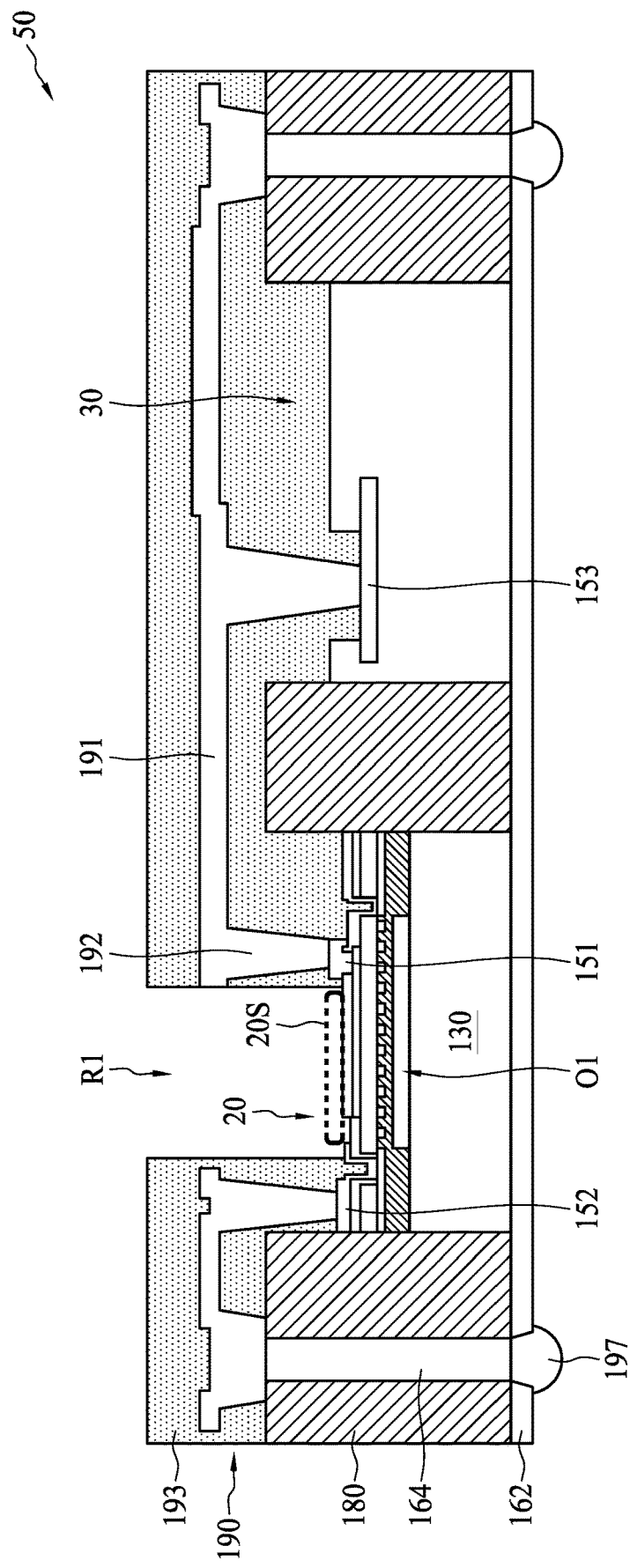

In operation 321, the dicing pad 195 is removed, as shown in FIG. 31. The frame 196 may also be removed. At this stage, the semiconductor device 50 is formed.

Figure 32:
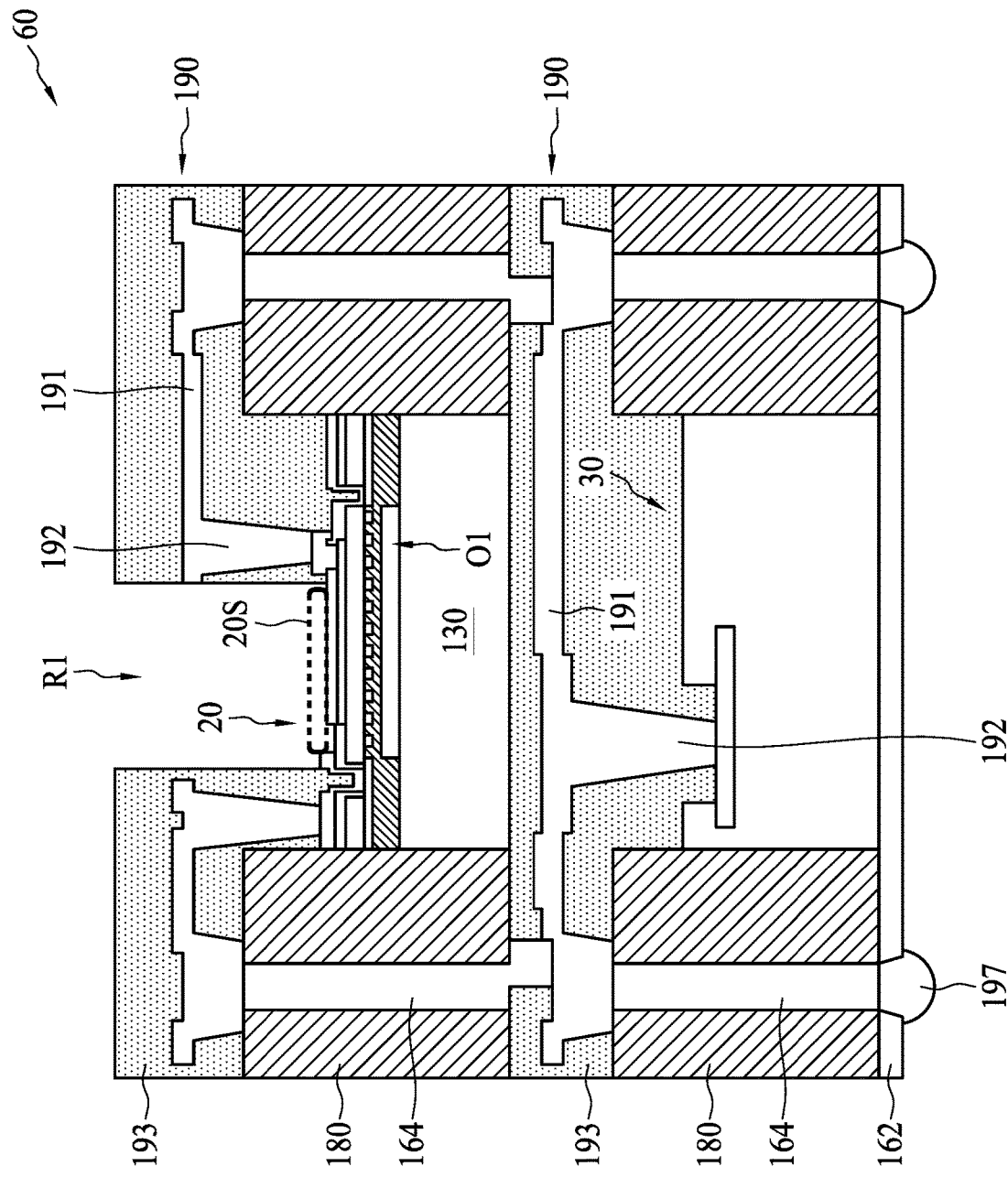

FIG. 32 is a schematic cross-sectional view showing a semiconductor device 60. The semiconductor device 60 is similar to the semiconductor device 50 in FIG. 31 with a difference that the PMUT device 20 is disposed over the ASIC die 30, rather than adjacent to the ASIC die 30. The semiconductor device 60 may include two RDLs 190, one of which is over the PMUT device 20 and the other is over the ASIC die 30. The PMUT device 20 may be electrically coupled to the ASIC die 30 through the RDL 190 and at least one of the conductive pillars 164.

Figure 33A:
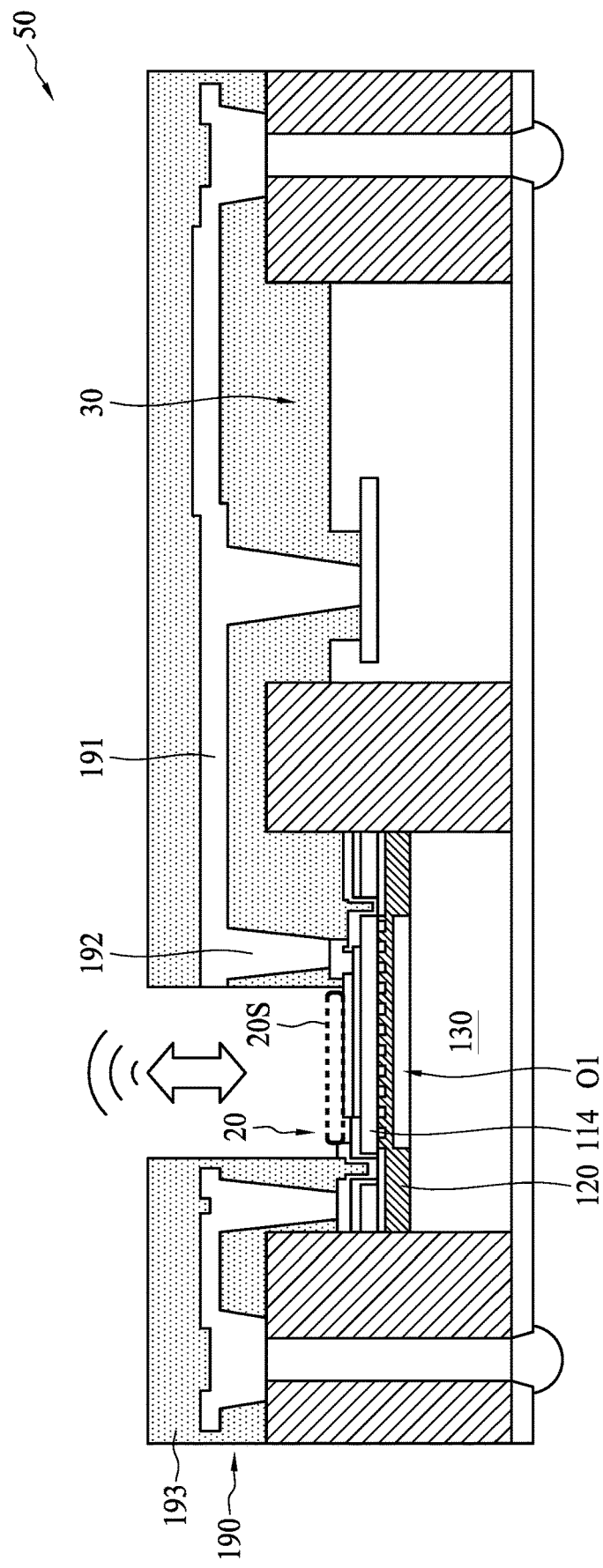
FIGS. 33A and 33B are schematic cross-sectional views showing the PMUT device that is functioning.
Figure 33B:
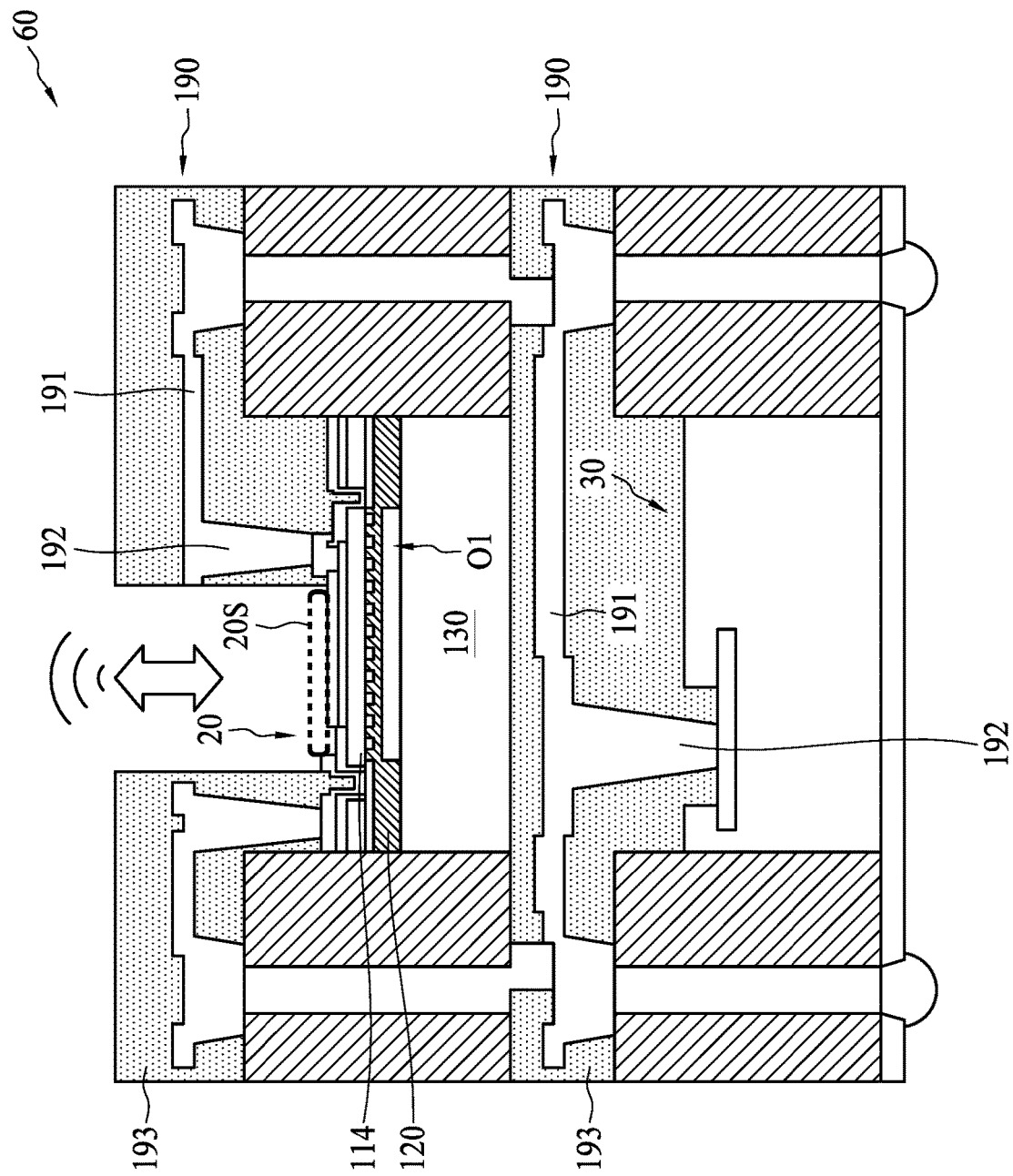

FIGS. 33A and 33B are schematic cross-sectional views respectively showing the PMUT device 20 of the semiconductor device 50 and the PMUT device 20 of the semiconductor device 60 that are functioning. The PMUT device 20 can operate in a flexural mode using the membrane 120 coupled with the piezoelectric film 114. When an electric field is applied over the piezoelectric film 114 sandwiched between a pair of electrodes, a transverse stress is created and a bending moment resulting in a deflection of the membrane 120 is generated. When the membrane 120 vibrates, it generates an acoustic wave into the surrounding medium (for example air, water, or blood). At this point, the PMUT device 20 operates in a transmit (Tx) mode. The transmitted wave hits a target object, the wave reflects and deflects the membrane 120, which now operates in a receive (Rx) mode. In Rx mode, this deflection creates small stress and electric charge that requires further amplification and is detected by the ASIC die 30, to be analyzed.

Figure 34:
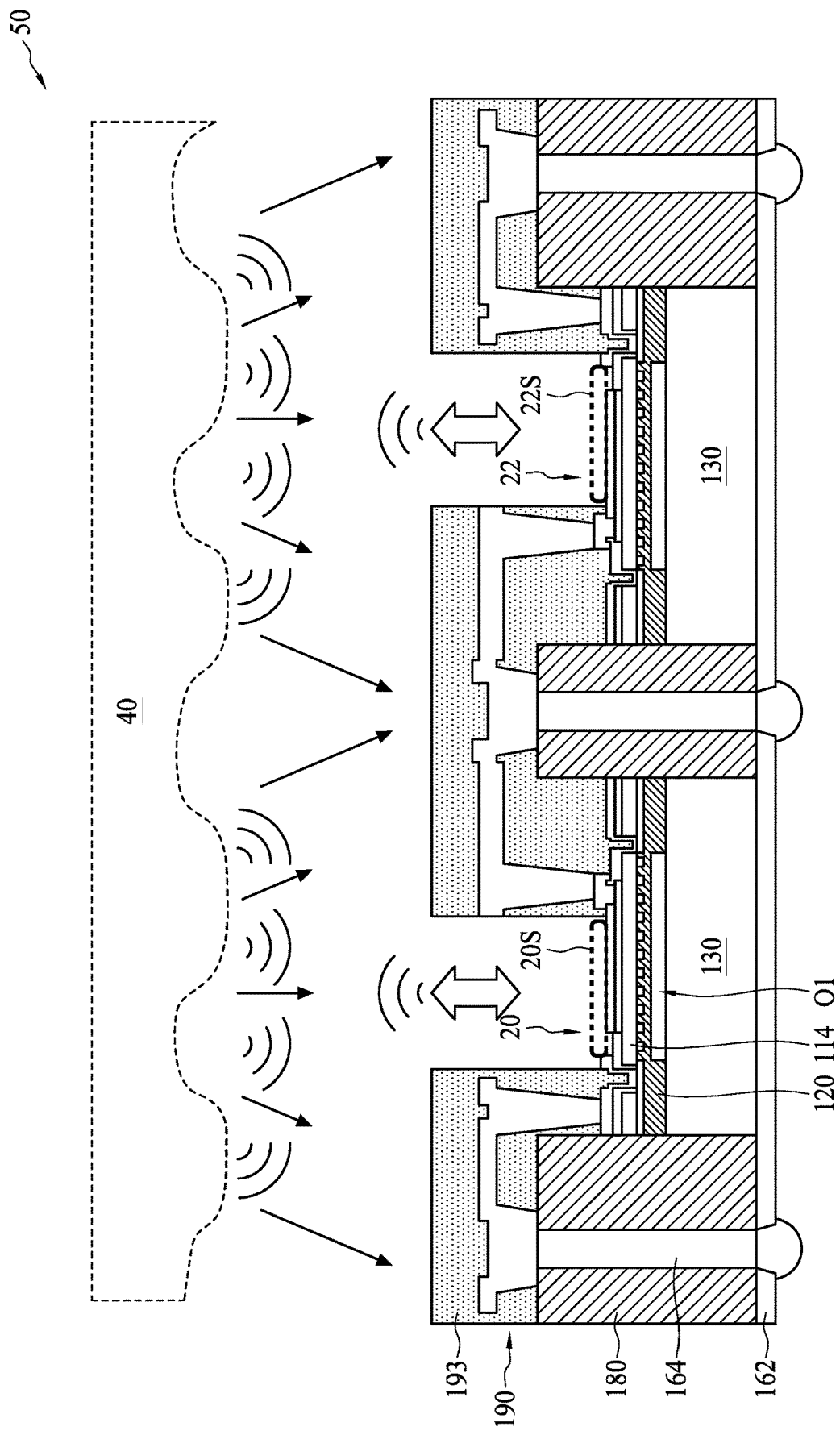
FIG. 34 is schematic cross-sectional view of the semiconductor device along a direction where two PMUT devices are adjacent to each other.

FIG. 34 is schematic cross-sectional view of the semiconductor device 50 along a direction where a PMUT device 20 is adjacent to a PMUT device 22. The PMUT device 20 and the PMUT device 22 may be surrounded by the molding compound 180 and a conductive pillar 164 may be disposed between the PMUT device 20 and the PMUT device 22. In some embodiments, the sensing area 20S of the PMUT device 20 is separated from a sensing area 22S of the PMUT device 22 by the isolation layer 193. When an external signal 40 is applied to the sensing area 20S of the PMUT device 20 or the sensing area 22S of the PMUT device 22, the isolation layer 193 can prevent the external signal 40 from rebounding or scattering. That is, the isolation layer 193 can decrease a crosstalk between the two sensing areas 20S and 22S of adjacent PMUT devices 20 and 22. Thus, the signal-to-noise ratio (SNR) of the semiconductor device 50 can be improved.

The present disclosure employs an integrated fan-out (InFO) technique to integrate one or more PMUT devices and an ASIC. The InFO technique interconnects the PMUT devices and the ASIC through RDLs and TIVs, which allows multiple actuators to be controllable and accessible at the same time. Using the integration of the PMUT devices and the ASIC, the number of I/O pads can be decreased, and thus space for disposing the I/O pads can be saved. In addition, the isolation layer of the RDL can decrease the crosstalk between adjacent PMUT devices. A better acoustic transmitting/receiving efficiency can be achieved.

One aspect of the present disclosure provides a semiconductor device. The semiconductor device includes a first device and a second device disposed adjacent to the first device; a conductive pillar disposed adjacent to the first device or the second device; a molding surrounding the first device, the second device and the conductive pillar; and a redistribution layer (RDL) over the first device, the second device, the molding and the conductive pillar, wherein the RDL electrically connects the first device to the second device and includes an opening penetrating the RDL and exposing a sensing area over the first device.

One aspect of the present disclosure provides another semiconductor device. The semiconductor device includes a first PMUT device; a second PMUT device disposed adjacent to the first PMUT device; a molding surrounding the first PMUT device and the second PMUT device; and a redistribution layer (RDL) over the first PMUT device, the second PMUT device and the molding, wherein the RDL electrically connects the first PMUT device to the second PMUT device, and includes a first opening exposing a first sensing area of the first PMUT device and a second opening exposing a second sensing area of the second PMUT device.

Another aspect of the present disclosure provides a method of manufacturing a semiconductor device. The method includes: providing a substrate; disposing a first device and a second device on the substrate; forming a sacrificial layer over the first device and the second device; forming a conductive pillar over the substrate; forming a molding over the substrate and surrounding the first device, the second device, the conductive pillar and the sacrificial layer; removing some portions of the molding to expose the sacrificial layer and the conductive pillar; removing the sacrificial layer; forming a redistribution layer (RDL) over the first device, the second device, the molding and the conductive pillar, wherein the RDL electrically connects the first device to the second device; and forming an opening extending through the RDL to expose a sensing area of the first device.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first device and a second device disposed adjacent to the first device;
   a conductive pillar disposed adjacent to the first device or the second device;
   a molding surrounding the first device, the second device and the conductive pillar; and
   a redistribution layer (RDL) over the first device, the second device, the molding and the conductive pillar, wherein the RDL electrically connects the first device to the second device and includes an opening penetrating the RDL and exposing a sensing area over the first device.

2. The semiconductor device of claim 1, further comprising a die attach film in contact with the conductive pillar, the first device and the second device, and separated from the RDL.

3. The semiconductor device of claim 1, wherein the first device includes an actuator aligned with the sensing area and a sensor surrounding the actuator.

4. The semiconductor device of claim 1, wherein the first device is a piezoelectric micromachined ultrasonic transducer (PMUT) or a capacitive micromachined ultrasonic transducer (CMUT).

5. The semiconductor device of claim 1, wherein the second device is an application specific integrated circuit (ASIC) die including a digital signal processing (DSP) chip, a driver or a decoder.

6. The semiconductor device of claim 1, wherein the first device includes a first conductive feature disposed thereon and facing the RDL, the second device includes a second conductive feature disposed thereon and facing the RDL.

7. The semiconductor device of claim 6, wherein the RDL includes:
an isolation layer; and
a plurality of conductive wires embedded in the isolation layer, wherein at least one of the plurality of conductive wires electrically connects the first conductive feature in the first device to the second conductive feature in the second device.

8. A semiconductor device, comprising:
a first PMUT device;
a second PMUT device disposed adjacent to the first PMUT device;
a molding surrounding the first PMUT device and the second PMUT device; and
an RDL over the first PMUT device, the second PMUT device and the molding, wherein the RDL
electrically connects the first PMUT device to the second PMUT device, and
includes a first opening exposing a first sensing area of the first PMUT device and a second opening exposing a second sensing area of the second PMUT device.

9. The semiconductor device of claim 8, wherein the first PMUT device and the second PMUT device are separated by the molding.

10. The semiconductor device of claim 8, wherein the first sensing area and the second sensing area are separated by an isolation layer of the RDL.

11. The semiconductor device of claim 10, further comprising a conductive pillar adjacent to the first PMUT device or the second PMUT device, wherein the conductive pillar is surrounded by the molding and covered by the isolation layer.

12. The semiconductor device of claim 8, wherein each one of the plurality of first devices includes:
a substrate;
a membrane on the substrate, wherein a cavity is between the membrane and the substrate;
a bottom electrode on the membrane;
a top electrode over the bottom electrode; and
a piezoelectric layer between the bottom electrode and the top electrode.

13. The semiconductor device of claim 12, wherein the bottom electrode includes a plurality of island electrodes, and the cavity is aligned with the plurality of island electrodes.

14. The semiconductor device of claim 12, wherein the cavity is disposed on a first side of the membrane, and the bottom electrode is disposed on a second side of the membrane opposite to the first side.

15. The semiconductor device of claim 12, wherein the membrane includes at least one film made of polycrystalline silicon, amorphous silicon, $SiO_2$, $Al_2O_3$, $Ta_2O_5$, $HfO_2$, $Si_3N_4$, $Y_2O_3$, $ZrO_2$, $TiO_2$ or $La_2O_3$.

16. A semiconductor device, comprising:
a first transducer device;
a second transducer device separated from the first transducer device by a molding compound; and
an RDL disposed over the first transducer device, the second transducer device and the molding compound, wherein the RDL includes:
a first pillar electrically coupled to the first transducer device;
a second pillar electrically coupled to the second transducer device;
a wire electrically connecting the first pillar and the second pillar; and
an isolation layer surrounding the first pillar, the second pillar and the wire.

17. The semiconductor device of claim 16, wherein the first transducer device or the second transducer device includes:
a carrier; and
a membrane disposed on the carrier, wherein a cavity is disposed between the membrane and the carrier.

18. The semiconductor device of claim 16, wherein the RDL further includes:
a first opening penetrating the isolation layer and exposing a first sensing area of the first transducer device; and
a second opening penetrating the isolation layer exposing a second sensing area of the second transducer device.

19. The semiconductor device of claim 16, further comprising a conductive pillar extending within the molding compound and disposed between the first transducer device and the second transducer device.

20. The semiconductor device of claim 19, wherein the first pillar, the second pillar or the wire is electrically coupled to the conductive pillar.

* * * * *